United States Patent
Haghighat et al.

(10) Patent No.: US 6,692,662 B2
(45) Date of Patent: Feb. 17, 2004

(54) COMPOSITIONS PRODUCED BY SOLVENT EXCHANGE METHODS AND USES THEREOF

(75) Inventors: R. Ross Haghighat, Westford, MA (US); Jae Ryu, Lowell, MA (US); Hamid R. Mojazza, Chelmsford, MA (US); Michael A. Vinciguerra, Hampton, NH (US); Peter Schuler, Westwood, MA (US)

(73) Assignee: Elecon, Inc., Chelmsford, MA (US)

( * ) Notice: Subject to any disclaimer, the term of this patent is extended or adjusted under 35 U.S.C. 154(b) by 46 days.

(21) Appl. No.: 09/999,171

(22) Filed: Nov. 30, 2001

(65) Prior Publication Data

US 2003/0006401 A1 Jan. 9, 2003

Related U.S. Application Data

(60) Provisional application No. 60/298,174, filed on Jun. 13, 2001, and provisional application No. 60/269,606, filed on Feb. 16, 2001.

(51) Int. Cl.[7] .............................. H01B 1/12; H01B 1/20; C08G 75/00
(52) U.S. Cl. ................. 252/500; 252/301.32; 528/373; 528/377
(58) Field of Search ........................... 252/500, 301.32; 528/373, 377, 378; 257/82; 362/800

(56) References Cited

U.S. PATENT DOCUMENTS

| | | | |
|---|---|---|---|
| 4,237,441 A | 12/1980 | Van Konynemburg | |
| 5,300,575 A | 4/1994 | Jonas | |
| 5,378,407 A | 1/1995 | Chandler | |
| 5,401,437 A | 3/1995 | Im | |
| 5,401,537 A * | 3/1995 | Kochem et al. | 427/384 |
| 5,403,467 A * | 4/1995 | Jonas et al. | 205/125 |
| 5,618,469 A | 4/1997 | Harley | |
| 5,766,515 A * | 6/1998 | Jonas et al. | 252/500 |
| 5,904,961 A | 5/1999 | Tang | |
| 5,998,014 A * | 12/1999 | Muller et al. | 428/335 |
| 6,083,635 A | 7/2000 | Jonas | |
| 6,084,040 A | 7/2000 | Jonas | |
| 6,172,591 B1 | 1/2001 | Barrett | |
| 6,429,248 B2 * | 8/2002 | Schwark et al. | 524/315 |

FOREIGN PATENT DOCUMENTS

| | | |
|---|---|---|
| DE | 4211459 | 10/1993 |
| EP | 302304 A | 2/1989 |
| EP | 686662 B1 | 12/1995 |
| WO | WO 02/067273 A1 | 2/2002 |

OTHER PUBLICATIONS

Burroughes, J. H., et al., Nature, New Semiconductor Device Physics in Polymer Diodes and Transistors, (1988) 335, pp 137–141.

Sirringhaus, High Resolution Inkjet Printing of All–Polymer Transistor Circuits, Science Magazine, Dec. 15, 2000, pp. 2123–2126, vol. 290.

Sirringhaus, H., et al., Nature, 401, pp. 2.

Skotheim, T. J., Handbook on Conducting Polymers (1986) Dekker, New York Pub. Info. Only.

Dagni, R., Chemistry and Engineering (Jan. 1, 2001) pp. 26–27.

(List continued on next page.)

Primary Examiner—Mark Kopec
(74) Attorney, Agent, or Firm—Raymond A. Miller; Pepper Hamilton LLP

(57) ABSTRACT

Disclosed are compositions formed by a method for exchanging solvent in a mixture that includes water and an optionally substituted thiophene. Also disclosed are methods for making and using such compositions.

12 Claims, 19 Drawing Sheets

OTHER PUBLICATIONS

Cao, Y., et al., Conjugated Polymetric Materials; Opportunities in Electronics, Optoelectronics and Molecular Electronics, (1990) NATO Advanced Study Institute, Series E: Applied Sciences, J.L. Bredas and R.R. Chance EDS vol. 82, Kluwer Academic, Holland pp 171–193.

www.bayerus,com; Bayer AG Product Literature (Edition 10/97; Order No. Al 5593) Inorganic Business Group D–51368, Leverkusen, Germany.

Groenendaal, et al., Poly (3, 4–ethylendioxthiophne) and its Derivatives: Past, Present and its Derivatives: Past, Present, and Future, Advanced Materials, (2000), pp 481–494, vol. 12, No. 7.

Roncall, Synthetic Principles for Bandgap Control in Linear II–Conjugated Systems, Chemical Reviews, (1997), pp. 173–205.

Kraft, Elektrolumineszeirende Konjugierte Polymere–Polymere Erstrahlen in Neuem Licht, AUFSATZE.

Roncali, Electrogenerated Functional Conjugated Polymers as Advanced Electrode Material, Journal of Chemistry (1999) pp. 1875–1893.

Roncali, Linear Conjugated Systems with Tailored Electric Properties, Ann. Rep., (1999) pp. 47–88.

Shirakawa, E.J., et al., Synthesis of Electrically Conducting Organic Polymers: Halogen Derivatives of Polyacetylene, (CH), J.C.S. Chem, Comm (1977) pp. 578–580.

Sirringhaus, Two–Dimensional Chargetransport in Self–Organized High Mobility Conjugated Polymers, Macmillan Magazine, Oct. 14, 1999, pp. 685–688, vol. 401.

Kobmehl, G., et al., Adv. Polym. Sci., 129, 1 (1996) Pub. Info. Only.

* cited by examiner

| Batch # | MAV2-72 | MAV2-77 | MAV2-79 | MAV2-80 | MAV2-81 | MAV2-82 | MAV2-84 | MAV2-83 |
|---|---|---|---|---|---|---|---|---|
| Quantity | 22L | 22L | 5L | 1L | 5L | 5L | 22L | 5L |
| Solvent | NMP | NMP | NMP | DMAc | NMP | NMP | NMP | NMP |
| Conductivity | S=4.77X10$^7$ ohm·sq  V=3.60 x 10$^8$ ohm-cm | S=2.91X10$^8$ ohm·sq  V=1.86 x 10$^7$ ohm-cm | Ohm2 = 0.02-0.04 MOhm  Ohm4 = 0.003-0.005 MOhm | Ohm2 = 0.009-0.01 MOhm  Ohm4 = 0.0015 MOhm | Ohm2 = 0.02-0.04 MOhm  Ohm4 = 0.005 MOhm | Ohm2 = 0.02-0.04 MOhm  Ohm4 = 0.002-0.005 MOhm | Ohm2 = 0.1-0.3 MOhm  Ohm4 = 0.03-0.04 MOhm | Ohm2 = 0.005-0.01 MOhm  Ohm4 = 0.002 MOhm |
| Viscosity-Brookfield (spindle #2 @100 rpm) 25C | 40 cP | 48 cP | 51 cP | 50 cP | 51 cP | 42 cP | 51 cP | 45 cP |
| Solids Content oven temp. 210C | 0.52% | 0.384% | 0.924% | 1.554% | 0.951% | 0.986% | 0.477% | 0.549% |
| Particle size and distribution | 1.1 um | 19.0 um | 14.5 um | 5.6 um | 11.6 um | 14.8 um | 8.0 um | 35.9 um |
| Transmission 5% TOR-CP | T=28.8%  H=0.48% | T=32.0%  H=0.22% | T=12.3%  H=1.40% | T=0.22%  H=13.5% | T=13.2%  H=1.46% | T=14.9%  H=1.18% | T=25.0%  H=0.78% | T=25.8%  H=0.40% |
| Ph Value | 4.91 | 4.97 | 4.04 | 6.61 | 3.94 | 3.45 | 4.95 | 4.30 |
| Density | 1.037 g/cc | 1.036 g/cc | 1.033 g/cc | 0.956 g/cc | 1.034 g/cc | 1.034 g/cc | 1.034 g/cc | 1.034 g/cc |
| Water Content | 6.13% | 4.90% | 0.64% | 5.75% | 0.74% | 1.42% | 2.19% | 0.37% |

Figure 4

| Batch # | MAV2-85 | MAV2-86 | MAV2-89 | KAC2-167 | MAV2-87 | MAV2-88 | MAV2-90 | KAC3- |
|---|---|---|---|---|---|---|---|---|
| Quantity | 22L | 5L | 5L | 5L | From lot 77 | From lot 79 | 5L | 5L |
| Solvent | NMP | NMP | NMP | NMP | | | NMP | NMP |
| Conductivity | Ohm2 = 0.01-0.04 MOhm  Ohm4 = 0.005-0.01 MOhm | Ohm2 = 0.01 MOhm  Ohm4 = 0.001 MOhm | Ohm2 = 0.03-0.04 MOhm  Ohm4 = 0.004-0.005 MOhm | Ohm2 = 0.02-0.06 MOhm  Ohm4 = 0.004-0.007 MOhm | | | | |
| Viscosity-Brookfield (spindle #2 @100 rpm) 25C | 42 cP | 61 cP | 64 cP | 38 cP | | | | |
| Solids Content oven temp. 210C | 0.378% | 0.428% | 0.664% | 0.622% | | | 0.904% | 0.935% |
| Particle size and distribution | 42.5 um | 8.3 um | | | | | | |
| Transmission 5% TOR-CP | T=40.0%  H=0.20% | T=21.5%  H=0.72% | T=17.9%  H=0.89% | T=35.2%  H=0.18% | | | | |
| Ph Value | 2.85 | 3.30 | 3.37 | 3.35 | | | | |
| Density | 1.032 g/cc | 1.038 g/cc | 1.037 g/cc | 1.033 g/cc | | | | |
| Water Content | 1.57% | 3.83% | | | | | | |

Figure 5

Drawdown conductivity measurements

| Sample ID | % solids | Wet Film thickness | Calculated dry film thickness (0.7 x Wet thickness) x (% solids) | Measured resistance with ohmmeter | 4 point probe resistance (ohm/4 scale) | Appearance |
|---|---|---|---|---|---|---|
| MAV2-92 | 0.55 | 120 micron | 0.46 micron | 1637Ω/sq, 1828Ω/sq, 1504Ω/sq | 0.5K 0.8K 0.7K | Smooth |
| MAV2-93 | 0.48 | 120 micron | 0.40 micron | 84KΩ/sq 94KΩ/sq | 0.025M 0.022M | Smooth |
| MAV2-94 | 0.38 | 120 micron | 0.32 micron | 11KΩ/sq 6KΩ/sq 10KΩ/sq | 3K 2.6K 1.7K 2K | Smooth |
| MAV2-95 | 0.43 | 120 micron | 0.36 micron | 1200Ω/sq 1600Ω/sq | 0.63K 0.6K 0.73K | Smooth |
| MAV2-96 | 0.62 | 120 micron | 0.52 micron | 13KΩ/sq 13KΩ/sq 17KΩ/sq 18KΩ/sq | 6K 6.1K 5.4K 6K | Smooth |
| MAV2-83 | 0.55 | 120 micron | 0.46 micron | 4290Ω/sq 2429Ω/sq | 0.86K 0.78K 1.5K | Segregated |
| MAV2-84 | 0.48 | 120 micron | 0.40 micron | 12.7KΩ/sq 18.2KΩ/sq | 5.2K 8.0K 4.3K | Smooth |
| MAV2-85 | 0.38 | 120 micron | 0.32 micron | 158KΩ/sq 1400MΩ/sq | — | Segregated |
| MAV2-86 | 0.43 | 120 micron | 0.36 micron | 1200Ω/sq 2600Ω/sq | 0.5K 0.51K 0.5K | Smooth |
| MAV2-77 | 0.38 | 120 micron | 0.52 micron | 1776Ω/sq 1915Ω/sq | 0.74K 0.61K 0.63K | Grainy |
| Baytron P | 1.3 | 120 micron | 1.09 micron | 76KΩ/sq 65KΩ/sq 96K /sq | 31K 21K 30K | Smooth |
| Baytron P | 1.3 | 60 micron | 0.54 micron | 114KΩ/sq 128KΩ/sq 124K /sq | 0.05M 0.05M 0.05M | Smooth |
| Baytron P | 1.3 | 30 micron | 0.27 micron | 48KΩ/sq 43KΩ/sq 59KΩ/sq | 0.02M 1.5M 0.01M 2.5K | Smooth |
| Baytron P | 0.5 | 120 micron | 0.42 micron | 37KΩ/sq 157KΩ/sq 46KΩ/sq | 1M 7M 0.3M | Smooth |
| Baytron P | 0.5 | 60 micron | 0.21 micron | 38KΩ/sq 33KΩ/sq 34K /sq | 1.1M 0.01M 0.01M 0.01M | Smooth |
| Baytron P | 0.5 | 30 micron | 0.10 micron | 103KΩ/sq 105KΩ/sq | 22K 0.8M 30M | Smooth |

Figure 6

| Batch # | MAV2-72 | MAV2-77 | MAV2-79 | MAV2-80 | MAV2-81 | MAV2-82 | MAV2-84 | MAV2-83 | MAV2-85 |
|---|---|---|---|---|---|---|---|---|---|
| Quantity | 22L | 22L | 5L | 1L | 5L | 5L | 22L | 5L | 22L |
| Solvent | NMP | NMP | NMP | DMAc | NMP | NMP | NMP | NMP | NMP |
| Conductivity | S=4.77X10⁻⁵ ohm/sq | S=2.91X10⁻⁵ ohm/sq | Ohm2=0.02-0.04 MOhm | Ohm2=0.009-0.01 MOhm | Ohm2=0.02-0.04 MOhm | Ohm2=0.02-0.04 MOhm | Ohm2=0.1-0.3 MOhm | Ohm2=0.003-0.01 MOhm | Ohm2=0.001-0.04 MOhm |
|  | V=3.60X10⁻⁵ ohm-cm | V=1.16 x 10⁻⁵ ohm-cm | Ohm4=0.003-0.005 MOhm | Ohm4=0.0015 MOhm | Ohm4=0.005 MOhm | Ohm4=0.003-0.005 MOhm | Ohm4=0.03-0.04 MOhm | Ohm4=0.003 MOhm | Ohm4=0.003-0.01 MOhm |
| Viscosity-finished batch @ 100 rpm,25C | 40 cP | 48 cP | 51 cP | 50 cP | 51 cP | 42 cP | 51 cP | 45 cP | 42 cP |
| Solids Content, oven temp, 210C | 0.52% | 0.38% | 0.92% | 1.55% | 0.95% | 0.99% | 0.48% | 0.55% | 0.56% |
| Particle sizes and distributions | 1.1 um | 19.0 um | 14.5 um | 5.6 um | 11.6 um | 14.8 um | 8.0 um | 35.9 um | 42.5 um |
| Transmission 5% | T=26.3% H=0.48% | T=32.0% H=0.22% | T=12.3% H=1.40% | T=0.22% H=13.5% | T=13.2% H=1.46% | T=14.9% H=1.18% | T=25.0% H=0.78% | T=25.8% H=0.40% | T=40.0% H=0.20% |
| TOR-cP | 4.91 | 4.97 | 4.04 | 6.61 | 3.94 | 3.45 | 4.95 | 4.5 | 2.15 |
| Pk Value |  |  |  |  |  |  |  |  |  |
| Density | 1.037 g/cc | 1.036 g/cc | 1.003 g/cc | 0.956 g/cc | 1.034 g/cc | 1.034 g/cc | 1.034 g/cc | 1.034 g/cc | 1.032 g/cc |
| Water Content | 6.13% | 4.90% | 0.64% | 5.75% | 0.74% | 1.42% | 2.19% | 0.37% | 1.57% |
| Drawdown surface resistance (avg) | 1236 Ω/sq | 1845 Ω/sq | 2660 Ω/sq |  | 2150 Ω/sq | 3725 Ω/sq | 15,500 Ω/sq | 33600 Ω/sq | 779,000 Ω/sq |

Figure 7A

| | MAV2-86 | MAV2-89 | KAC2-167 | MAV2-87 | MAV2-88 | MAV2-90 | KAC3-26 | MAV2-91 | KAC3-40 | MAV2-92 |
|---|---|---|---|---|---|---|---|---|---|---|
| | SL | SL | SL | From lot 77 | From lot 79 | SL | SL | SL | SL | From lot 83 |
| | | | | Fluidized | Fluidized | | | | | Fluidized |
| | NMP | NMP | NMP | NMP | NMP | NMP | NMP | NMP | NMP | NMP |
| | Ohm2 = 0.01 MOhm | Ohm2 = 0.03-0.04 MOhm | Ohm2 = 0.03-0.06 MOhm | Ohm2 = 0.01 MOhm | | Ohm2 = 0.05-0.1 MOhm | Ohm2 = 0.04-0.1 MOhm | Ohm2 = 0.01-0.02 MOhm | Ohm2 = 0.04-0.1 MOhm | Ohm2 = 0.02-0.04 MOhm |
| | Ohm4 = 0.001 MOhm | Ohm4 = 0.004-0.005 MOhm | Ohm4 = 0.004-0.007 MOhm | Ohm4 = 0.002 MOhm | | Ohm4 = 0.003-0.01 MOhm | Ohm4 = 0.006-0.01 MOhm | Ohm4 = 0.001-0.003 MOhm | Ohm4 = 0.005 MOhm | Ohm4 = 0.002-0.004 MOhm |
| | 61 cP | 64 cP | 38 cP | | | 48 cP | 45 cP | 54 cP | 64 cP | |
| | 0.45% | 0.66% | 0.62% | 0.18% | 0.92% | 0.90% | 0.94% | 0.62% | 0.77% | 0.55% |
| | 8.3 um | 2.4 um | 33.7 um | 0.21 um | 1.14 um | 20.8 um | 23.5 um | 24.8 um | 6.6 um | 0.34 um |
| | T = 21.5% H = 0.72% | T = 17.9% H = 0.89% | T = 33.2% H = 0.18% | | | T = 19.2% H = 1.09% | T = 24.2% H = 1.09% | T = 17.8% H = 1.41% | T = 13.5% H = 1.05% | |
| | 3.3 | 3.37 | 3.35 | | | 3.49 | 3.32 | 3.68 | 3.74 | |
| | 1.036 g/cc | 1.037 g/cc | 1.033 g/cc | | | 1.035 g/cc | 1.034 g/cc | 1.035 g/cc | 1.004 g/cc | |
| | 3.05% | 4.19% | 0.10% | | | 0.51% | 0.20% | 1.48% | 2.25% | |
| | 1900 Ω/sq | 4040 Ω/sq | 29,000 Ω/sq | 1880 Ω/sq | 13,625 Ω/sq | 24,000 Ω/sq | 24710 Ω/sq | 3100 Ω/sq | 10,000 Ω/sq | 1656 Ω/sq |

Figure 7B

| MAV2-93 | MAV2-94 | MAV2-95 | MAV2-96 | MAV2-97 | MAV2-99 | MAV2-100 |
|---|---|---|---|---|---|---|
| From lot 84 | From lot 85 | From lot 86 | From lot KAC2-167 | From lot 77 | | 1/12/01 |
| Fluidized | Fluidized | Fluidized | Fluidized | Fluidized - 1 pass | | |
| NMP | NMP | NMP | NMP | NMP | | NMP |
| Ohm2 = 0.3-0.6 MOhm | Ohm2 = 0.1-0.3 MOhm | Ohm2 = 0.01-0.05 MOhm | Ohm2 = 0.05-0.04 MOhm | Ohm2 = 0.005 MOhm | | |
| Ohm1 = 0.03-0.06 MOhm | Ohm1 = 0.01-0.03 MOhm | Ohm1 = 0.001-0.003 MOhm | Ohm1 = 0.002 MOhm | Ohm1 = 0.0025 MOhm | | |
| 0.48% | 0.38% | 0.43% | 0.62% | 0.38% | | |
| 0.60 um | 0.63 um | 0.79 um | 0.11 um | 0.63 um | | 6.9% |
| | | | | | | |
| | | | | | | |
| | | | | | | |
| | | | | | | |
| | | | | | | |
| 89,000 Ω/sq | 9,000 Ω/sq | 1400 Ω/sq | 15,250 Ω/sq | 1827 Ω/sq | 1930 Ω/sq | 190 Ω/sq for 4 micron film; 421 Ω/sq for 2 micron film; 470 Ω/sq for 1 micron film |

Figure 7C

Formulation Performance Table

| Triton ID | Conductive component | Date Measured | Surface resistance (Ohms/sq) | Thickness | Comments |
|---|---|---|---|---|---|
| MAV2-87-1 | TOR-CP | | 0.62 M Ohm 620K | | |
| MAV2-87-2 | TOR-CP | | 0.42 M Ohm 420K | | |
| MAV2-87 | TOR-CP | | 0.81 M Ohm 810 K | | 1 layer 1 ml wet |
| MAV2-87 | TOR-CP | | 48 K | | 2 layers 1 ml wet |
| MAV2-77 | TOR-CP | | No reading | | 1 layer 1 ml wet |
| MAV2-77 | TOR-CP | | No reading | | 2 layers 1 ml wet |

Figure 8

Resistivity/Surface Resistance

| Sample | Thickness (nm) | Surface Resistance (ohm/sq) | Resistivity (ohm-cm) |
|---|---|---|---|
| Tor-CP-A1 | 69.9 | 1221 | 0.175 |
| Tor-CP-A2 | 107 | 744 | 0.15 |
| Tor-CP-O1 | 53 | 5546 | 0.596 |
| Tor-CP-O1 | 104.8 | 1846 | 0.397 |
| Tor-CP-O1 | 171 | 654 | 0.211 |
| Baytron-P-1 | 120 | 158400 | 162.74 |
| Baytron-P-1 | 314.3 | 75700 | 48.77 |
| Baytron-P-1 | 592.0 | 22130 | 26.86 |

| | | |
|---|---|---|
| Tor-CP-A1 | 69.9 | 0.175 |
| Tor-CP-A1 | 107 | 0.15 |
| Tor-CP-O1 | 53 | 0.596 |
| Tor-CP-O1 | 104.8 | 0.397 |
| Tor-CP-O1 | 171 | 0.211 |
| Baytron-P-1 | 120 | 162.74 |
| Baytron-P-1 | 314.3 | 48.77 |
| Baytron-P-1 | 592.0 | 26.86 |

| Layers | QZ01-72 | | | QZ01-72 5% NC | | | Baytron P | | |
|---|---|---|---|---|---|---|---|---|---|
| | Haze | Transmittance | Surface Resistance | Haze | Transmittance | Surface Resistance | Haze | Transmittance | Surface Resistance |
| 0 | 0.93 | 92.6 | not conductive | 0.95 | 92.6 | not conductive | 0.94 | 93.6 | not conductive |
| 1 | 1.66 | 91.6 | 10.29 | 1.25 | 91.9 | 8.50 | 1.19 | 88.2 | 180 |
| 2 | 2.13 | 89.4 | 1.67 | 1.90 | 88.8 | 1.93 | 1.24 | 79.4 | 116 |
| 3 | 2.18 | 87.4 | 1.36 | 1.93 | 87.0 | 1.30 | 1.17 | 75.9 | 64 | note: these samples were coated on PET (supplied by 3M)

Figure 15

COMPOSITIONS PRODUCED BY SOLVENT EXCHANGE METHODS AND USES THEREOF

CROSS-REFERENCE TO RELATED APPLICATIONS

The present application is a continuation-in-part of U.S. Provisional Application No. 60/298,174 as filed on Jun. 13, 2001, which application claims benefit to U.S. Provisional Application No. 60/269,606 as filed on Feb. 16, 2001. The disclosures of the U.S. S Nos. 60/298,174 and 60/269,606 applications are each incorporated herein by reference.

FIELD OF THE INVENTION

The present invention generally relates to compositions produced from solvent exchange processes. In general, the processes replace water in a thiophene mixture with at least one other solvent. A preferred thiophene mixture is a water saturated Baytron™ formulation. Also provided are useful articles including organic solvent based polymeric coatings as well as methods for making and using same.

BACKGROUND OF THE INVENTION

There is increasing recognition that performance of a wide spectrum of electronic and optical articles can be enhanced by including a conductive molecule. Examples of such articles include anti-static coatings, films, as well as a variety of electronic implementations. See generally *Handbook on Conducting Polymers* (Skotheim, T. J. ed.) (Dekker, New York, 1986).

Many types of conductive organic molecules have been reported. For example, U.S. Pat. Nos. 6,172,591; 4,237,441; and 5,378,407 disclose organic polymers with a carbon black or metallic conductive filler.

Organic polymers that are intrinsically conductive have attracted substantial interest. Generally, such polymers include $sp^2$ hybridized carbon atoms that have (or can be adapted to have) delocalized electrons for storing and communicating electronic charge. Some polymers are thought to have conductivities neighboring those traditional silicon-based and metallic conductors. These and other performance characteristics make such conductive polymers desirable for a wide range of applications. See Burroughes, J. H. et al. (1986) *Nature* 335:137; Sirringhaus, H. et al. (2000) *Science*, 290, 2123; Sirringhaus, H. et al. (1999) *Nature* 401:2; and references cited therein, for example.

Other conductive polymers have been reported. These polymers include a many optionally substituted polypyrrole, polyaniline, polyacetylene, and polythiophene compounds. See EP-A 302 304; EP-A 440 957; DE OS 4 211 459; U.S. Pat. Nos. 6,083,635 and 6,084,040; and Burroughes, J. H., supra.

There is recognition that many conductive polymers can be used to coat a wide range of synthetic or natural articles such as those made from glass, plastic, wood and fibers to provide an electrostatic or anti-static coating. Typical coatings can be applied as sprays, powders and the like using recognized coating or printing processes.

However there is increasing understanding that many prior conductive polymers are not useful for all intended applications.

For example, many of such polymers are not sufficiently conductive or transparent for many applications. In particular, many suffer from unacceptable conductivity, poor stability, and difficult processing requirements. Other shortcomings have been reported. See e.g., the U.S. Pat. Nos. 6,084,040 and 6,083,635.

There have been attempts to improve some of the prior conductive polymers.

For example, a particular 3,4-polyethylene dioxythiophene (commercially available as Baytron™ P) has been reported to offer good conductivity, transparency, stability, hydrolysis resistance and processing characteristics. See Bayer AG product literature (Edition 10/97; Order No. A1 5593) Inorganics Business Group D-51368, Leverkusen, Germany.

More specific Baytron™ formulations have been reported for use in specific applications.

Illustrative formulations (P type) include CPUD2, CPP103T, CPP105T, CPP116.6, CPP134.18, CP135, CPP 4531I, CPP 4531 E3 and CPG 130.6. Baytron™ M is reported to be a monomer of poly(3,4-ethylenedioxythiophene) and it has been reported to be useful in the manufacture of organic conductive polymers. Further information relating to using Baytron™ formulations can be obtained from the Bayer Corporation, 100 Bayer Rd. Pittsburgh, Pa. 15205-9741. See also the Bayer Corporation website at bayerus.com the disclosure of which is incorporated by reference.

Unfortunately, use of many prior mono- and polythiophene formulations has been problematic.

For example, many important Baytron™ formulations are provided with significant amounts of water solvent. In particular, many Baytron™ P formulations are available as water-saturated colloidal dispersions of the conductive polymer. Typically, a suitable counter ion such as polystyrene sulfonic acid (PSS) is added to the dispersion. There is increasing recognition that many, if not all, Baytron™ formulations would be more useful if means existed for exchanging the water solvent with one or more other solvents of choice.

There have been limited attempts to develop such solvent exchange methods. Nearly all of the attempts have relied on traditional liquid fractionation and distillation schemes. Such approaches have not been able to exchange the solvent for the water in a way that is effective and reproducible.

Flexible electronic device "writing" or "printing" has attracted much recent attention. An example of such a technique involves dispersing an aqueous and conductive thiophene preparation with an ink-jet printer. Typically, poly(3,4-ethylenedioxythiophene) doped with polystyrene sulfonic acid (PEDOT/PSS) is employed. See generally Dagni, R. in *Chemistry and Engineering,* Jan. 1, 2001, pp. 26–27 as well as references cited therein.

However, these writing or printing procedures have suffered for want of an effective and reproducible means of replacing the water with more useful exchange solvents.

There is recognition that many electro-optic devices, such as light emitting diodes (LED's) and photovoltaic cells, require electrically conductive and optically transparent films/coatings as electrode materials. Presently, transparent electrodes in electro-optic devices are made of indium doped tin oxide (ITO) coated glass substrates.

However, most prior ITO layers have suffered from shortcomings.

For example, most prior manufacturing processes involving ITO are cumbersome and costly to perform. An illustration is the need to conduct vacuum deposition in a controlled gas atmosphere. Furthermore, most prior ITO films are brittle, difficult to prepare and manipulate, particularly when used in film formats on large area substrates or flexible substrates. See generally Y. Cao, et al. in *Conjugated Polymeric Materials: Opportunities in Electronics, Optoelectronics and Molecular Electronics,* NATO Advanced Study Institute, Series E: Applied Sciences, J. L. Bredas and R. R. Chance, Eds., Vol. 82, Kluwer Academic, Holland (1990). See also U.S. Pat. No. 5,618,469 and EPO Patent 686,662.

There is belief that certain conducting polymers and coatings may be qualified for some organic light emitting diode (OLED) applications. Briefly, OLEDs are display compositions based on sandwiching deposited organic molecules or polymers between two electrodes. Light emission or luminescence occurs when charged carriers associate with the electrodes recombine and emit light. See U.S. Pat. No. 5,904,961, for instance.

More specifically, a typical OLED includes a metal cathode, electrode transport layer (ETL), organic emitters, the HIL, an ITO anode and glass substrate. Light output passes through the glass substrate.

Electrically conductive and optically transparent coatings have been made with polyaniline (PANI) (U.S. Pat. No. 5,618,469) and PEDOT/PSS polymer dispersion (Eur Patent 686662).

However, many of the prior coatings have recognized drawbacks particularly in relation to OLED applications.

As an example, many have limitations in manufacturing practical electro-optic devices. In particular, it is well known that many PANI systems are not stable. Performance degrades over time. Although there is some understanding that performance of PEDET:PSS-based devices are stable, many prior PEDET/PSS polymers are aqueous based. Fabricating PEDET:PSS coatings onto ITO coated substrates requires cumbersome manufacturing processes. Further, the hydrophilic nature of the PEDOT:PSS system attracts moisture, even through the protective moisture barrier. This characteristic has several disadvantages including premature failure during use.

It would be desirable to have coating and related compositions that are easy to make and use. It would be especially desirable to have solvent-exchanged PEDOT:PSS compositions as well as methods for making and using same that exhibit low resistivity and are suitable for OLED use.

SUMMARY OF THE INVENTION

The present invention relates to solvent exchange methods for replacing water in a thiophene mixture. Preferred methods of the invention replace some or all of the water with at least one other solvent. Preferably, the thiophene mixture is a Baytron™ formulation. Also provided are compositions produced by the methods as well as useful articles that include or consist of such compositions. The invention has a wide spectrum of important applications including providing converted (solvent exchanged) Baytron™ formulations for use in consumer goods and electronic writing techniques.

As discussed, it has been difficult to replace the water associated with many thiophene mixtures, particularly but not exclusively, mono- and polythiophene mixtures known as Baytron™ formulations. Such formulations are often provided as collodial or water saturated materials. The present invention addresses this need eg., by providing methods for replacing (exchanging) the water with at least one other more desirable solvent. Significantly, the present methods can be controlled by an invention user so that all or part of the water in mixture is exchanged as needed. Also significantly, the invention can be practiced using standard laboratory equipment, thereby making the invention cost effective in most embodiments. Preferred use of the invention expands the usefulness of thiophene mixtures, particularly the Baytron™ formulations, into applications that heretofore have been difficult or impossible to practice.

The present invention also relates to compositions, preferably polymer coatings, that are easy to make and use. Typically, such compositions are relatively stable and involve use of non- or low toxicity solvents. Preferred compositions according to the invention are PEDOT:PSS compositions, more preferably solvent-exchanged PEDOT:PSS coating compositions suitable for use in a range of electro-optical implemenations including OLEDs.

Such compositions provide advantages including good conductivity, high optical tranparency and environmental stability. Significantly, preferred compositions of the invention can be used to replace indium doped tin oxide (ITO) coated glass substrates that are part of many standard OLEDs.

Also encompassed by the invention are methods for making and using the present compositions. In one embodiment, the methods involve subjecting PEDOT:PSS compositions to conditions that decrease resistivity when compared to (control) compositions not receiving such treatment. Preferred conditions generally involve at least one drying treatment. Also disclosed are methods for making such compositions in which at least one of the method steps involves drying treatment. By the phrase "drying treatment" is meant exposure to at least one condition that causes, either directly or indirectly, loss of solvent from the composition, preferably exchanged solvent.

The drying treatments provided by the invention provide substantial advantages. In particular, practice of such treatment steps in the methods of the invention provide a straightforward and cost effective way of improving composition performance by assisting solvent loss. Preferred practice involves subjecting conductive coatings of the invention to ambient air and/or heat treatment to help remove solvent, and has been discovered, to help improve performance characteristics such as resistivity. Significantly, such drying treatments are compatible with most manufacturing processes and can be scaled-up as needed. More specific information about the drying treatments is provided in the discussion and examples following.

The invention also features electro-optical implementations that include at least one of the compositions disclosed herein including preferred PEDOT:PSS compositions. An illustration of such an implementation is an OLED or related device. Such OLEDs reduce or avoid use of hard-to-manipulate ITO components while providing coatings with improved performance features, especially resistivity. As provided below, it is an object of the invention to replace prior ITO components with at least one of the compositions of this invention provided as an OLED hole injection layer (HIL).

Accordingly, and in one aspect, the invention provides methods for exchanging (in whole or in part) the water present in a thiophene mixture with at least one other solvent. A preferred mixture includes at least one thiophene, preferably an optionally substituted mono- or polythiophene, more preferably a water saturated Baytron™ formulation. In one embodiment, the method includes at least one and preferably all of the following steps:

a) heating at least one solvent in a vessel under conditions suitable for vaporizing water, b) contacting the heated solvent with the thiophene mixture (comprising the water and at least one optionally substituted mono- or polythiophene), which contact is sufficient to remove at least part of the water from the mixture as vapor; and c) exchanging the water removed from the mixture with the solvent.

Preferred practice of the invention involves heating the solvent before contact with the thiophene mixture, although in some invention embodiments substantially contemporaneous solvent heating may be desirable. Preferred heating conditions favor production of water vapor from the mixture. Without wishing to be bound to theory, it is believed that heating the solvent before the contact helps to reduce prolonged contact between the thiophene mixture and the exchange solvent. Such limited contact has many benefits including enhancing water loss from the mixture and increasing exchange with the heated solvent. In contrast, prior practice has been limited to more traditional distillation schemes featuring gradual liquid heating and close solution contact. These schemes are not always designed to minimize contact between the exchanging solvent and the thiophene mixture. Such limited contact is also believed to reduce or avoid binding potential (covalent and non-covalent) between the water and exchange solvent. Such binding is believed to have impeded many past attempts to reduce the amount of or eliminate water from some thiophene mixtures. As will become more apparent from the following discussion, these and other features of the invention provide for more efficient solvent exchange than has heretofore been possible, particularly with many Baytron™ formulations.

Additionally preferred practice of the invention involves maximizing the contact area of the heated solvent with respect to the contact area of the thiophene mixture. Without wishing to be bound to any theory, it is believed that by increasing the heated solvent contact area relative to that of the thiophene mixture, it is possible to boost heat transfer from the exchange solvent to the mixture. In this invention example, the relatively large heated solvent contact area helps to transfer heat quickly and efficiently from the exchange solvent to the mixture. This invention feature also helps to achieve an invention objective ie, the reduction or elimination of unwanted binding between the water and exchange solvent.

The invention provides many other important advantages.

For example, in another aspect, the invention provides highly useful compositions that include or consist of at least one of the converted (solvent exchanged) thiophene mixtures. A preferred converted thiophene mixture is derived from an optionally substituted mono- or polythiophene, particularly a Baytron™ formulation in which the water solvent has been totally or partially replaced with at least one other solvent. In this invention embodiment, it has been found that such converted thiophene mixtures feature better electrical conductivity than corresponding unconverted (control) mixtures. Significantly, such better conductivity is achieved with films and coatings having less thickness than conventional films and coatings made from many Baytron™ formulations. Without wishing to be bound to theory, preferred practice of the invention is believed to provide for more conductive polymer chain orientations. This and other features of the invention will help expand the use of the Baytron™ formulations into a variety of applications in which good conductivity and minimal film or coating thickness is desired.

Turning to the invention methods, it will be understood that it is possible to increase the contact area of the heated solvent by one or a combination of strategies.

For example, in one embodiment, the foregoing solvent exchange method further includes adding about 1 unit volume of the thiophene mixture to more than about one unit volume of the heated solvent e.g., at least about 2 unit volumes of the heated solvent per unit volume of the mixture. The larger heated solvent volume provides the relatively large heated solvent contact area to move heat effectively from the exchange solvent to thiophene mixture.

The heated solvent, thiophene mixture (or both), can be provided in forms so that the heated solvent has a relatively large contact area when compared to the mixture. As an example, the contacting step of the methods can be adapted to include adding the thiophene mixture to the vessel as a flow stream, mist, aerosol; or a combination thereof having the larger contact area.

Typically, but not exclusively, the heated exchange solvent is provided as a pool in the vessel which pool has the relatively larger contact area relative to the added mixture. Addition of that mixture to the vessel can be continuous or discontinuous as needed e.g., as a semi-continuous flow stream or as drops of the mixture added to the pool of heated solvent. In another example, the contacting step of the method includes dispersing the mixture along the surface of the heated solvent. Such dispersal can be continuous or semi-continuous to further assist and maximize the contact area of the heated exchange solvent relative to the thiophene mixture. This example of the invention may be especially useful in instances in which the exchange solvent, the mixture (or both) are available in limited quantities. For some applications, it may be desirable to add the mixture below the surface of the heated solvent.

The methods of the invention are generally flexible and can be used to replace all or part of the water in a subject thiophene mixture with at least one other desired solvent. This feature of the invention further enhances the utility of many optionally substituted mono- and polythiophenes and especially many of the Baytron™ formulations. By way of illustration and not limitation, the invention can be used to replace a pre-determined amount of water in a Baytron™ M or P formulation with at least one other solvent including a combination of different solvents. It is thus possible to make many new thiophene mixtures and particularly a wide variety of converted (solvent exchanged) Baytron™ formulations. Such converted formulations having a pre-determined amount of water exchanged for solvent or combination of solvents can be used in a range of new applications.

As will be appreciated, the invention is compatible with a wide spectrum of solvents. Typically, the exchange solvent will include one solvent. However, for some applications it will be useful to employ a combination of solvents as the exchanging medium e.g, two to six solvents, preferably about two solvents. In another embodiment, the invention methods can be adapted so that all or part of the water in a thiophene mixture is exchanged for a first solvent (or solvent combination). If the resulting converted thiophene mixture includes unexchanged water, that water can be further exchanged (fully or partially) with a second solvent (or solvent combination), thereby making a further converted mixture. Further solvent exchange can be performed as needed. Choice of a particular solvent exchange procedure according to the invention will by guided by recognized parameters including the use for which a particular converted thiophene mixture is intended.

More specific solvents of the invention include those that are stable to heat conditions favoring water vaporization. A more preferred solvent or solvent combination for use in the method has a boiling point of at least about 100° C. at standard pressure (1 atmosphere (tam)). However in embodiments in which the water solvent can be vaporized below or above 100° C. other solvents may be more desirable e.g, those having boiling points below or above 100° C. at 1 atm. Exemplary embodiments include practice of the method in which the vessel has an internal pressure less or greater than about 1 atm. More specific exchange solvent examples include polar and non-polar solvents as well as solvents that are miscible or insoluble in water.

As mentioned, the invention provides compositions made entirely or in part with at least one of the converted (solvent exchanged) thiophene mixtures according to the invention. In one embodiment, the composition is an azeotrope. That is, the composition cannot be separated by fractional distillation into two or more pure substances. Such azeotropes include maximum-boiling azeotropes in which the boiling point of the heated solvent is raised by contact with the water solvent. Also included are minimum-boiling azeotropes in which the boiling point of the heated solvent is depressed by contact with the water solvent.

Preferred compositions of the invention feature an electrical conductivity that is at least about an order of magnitude larger than the corresponding unconverted (no solvent exchange) thiophene mixture when measured according to standard procedures. Particular converted polydioxythiophenes of the invention such as TOR-CP exhibit a conductivity increase that is about one to two orders of magnitude greater than Baytron™ P.

In another embodiment, the invention features more particular methods that include forming a composition from the mixture, preferably a coating composition, and subjecting that composition to at least one drying treatment step as defined herein. Preferably, the drying treatment is performed after step c) of the method (ie. solvent exchange step). Such treatment may be performed once or more than once as needed. More preferred drying treatments involve significant exposure to ambient room temperature or higher temperatures sufficient to remove solvent from the composition. In embodiments in which more than one drying treatment is desired eg., two, three or four of such treatments, the drying treatments may be the same or different as needed to achieve a particular result. In such embodiments, the drying treatments can be performed in a tandem or discontinuous format. Generally, but not exclusively, drying treatments of less than about one to two days are suitable for most invention applications. Less than about several hours, preferably less than a few hours will be preferred for most invention applications. Compositions produced by such methods are also featured herein.

In yet another aspect, the invention provides conductive materials, particularly coating materials and films that include or consist of the compositions provided by this invention. Preferred films suitably include at least one polymer, co-polymer or mixture thereof such as those disclosed below Such conductive materials are well-adapted for use in anti-static or electrostatic applications.

Also featured are conductive coatings that include or consist of the compositions provided herein, preferably configured as a layer having at least one of the following performance characteristics: 1) good resistivity; 2) good surface resistance; and 3) good optical transmission. Preferably, such compositions exhibit at least good resistivity. Examples of preferred conductive coatings are provided in the discussion that follows.

Also provided by the invention are articles of manufacture that include or consist of at least one of the compositions and coating materials of this invention.

In one embodiment, the articles are electro-optical implementations and preferably organic light emitting devices (OLED) such as those provided below.

In another aspect, the invention provides useful methods for making an electronic implementation, typically by "writing" or "printing", which methods include at least one and preferably all of the following steps:
a) contacting at least one of the compositions disclosed herein with a first polymer layer,
b) dissolving at least a portion of the first polymer layer with the composition under conditions forming a hole, typically a via-hole or interconnect, in the first polymer layer; and
c) evaporating the solvent in the composition to make the electronic implementation.

The foregoing method for making the electronic implementation has important advantages including providing better control of solvent surface tension as well as enhanced writing or printing alignment of the hole. Also provided are electronic implementations and manufactured articles produced by the method.

BRIEF DESCRIPTION OF THE DRAWINGS

FIG. 4 is a table showing data from eight (8) samples of Baytron™ P exchanged with NMP. The data provide conductivity, viscosity, solids content, particle size distribution, transmission, pH, density, and water content parameters.

FIG. 5 is a table showing data from eight (8) samples of Baytron™ P exchanged with NMP. The data provide conductivity, viscosity, solids content, particle size distribution, transmission, pH, density, and water content parameters.

FIG. 6 is a table showing data from ten (10) samples of Baytron™ P exchanged with NMP. Also shown are data from six (6) samples of neat (non-solvent exchanged) Baytron P.

FIGS. 7A, 7B, and 7C are tables showing data from selected samples of Baytron™ P exchanged with NMP or DMAc. Drawdown surface resistances are also illustrated.

FIG. 8 is a formulation performance table showing thickness and resistance properties of several TOR-CP batches.

FIG. 15 is a table showing data in support of FIGS. 13 and 14.

DETAILED DESCRIPTION OF PREFERRED EMBODIMENTS

Figure 1:
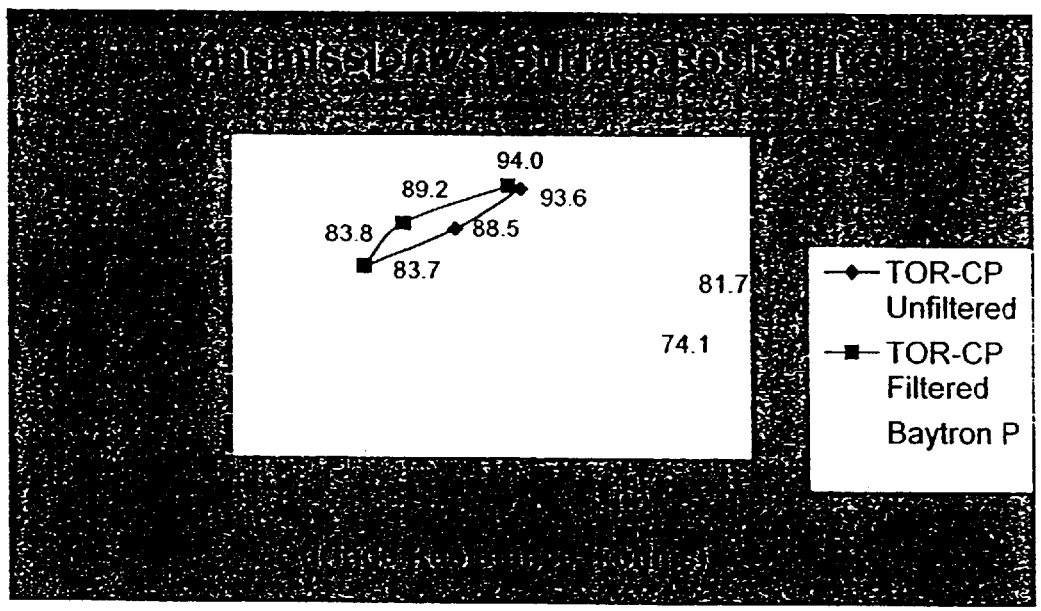
FIG. 1 is a graph showing optical transmission versus surface resistance of a converted (solvent exchanged) TOR-CP (Triton AO Resistant Conductive Polymer made from converted Baytron™ P) and Baytron P (neat). The TOR-CP was filtered or non-filtered.

As discussed, the invention provides highly useful methods for replacing some or all of the water associated with many thiophenes, preferably optionally substituted mono- and polythiophene mixtures. More preferred mixtures include Baytron™ formulations provided as M or P type. The invention has a variety of important applications including providing electrically conductive compositions useful in the manufacture of anti-static and electrostatic coatings, capacitor electrodes (tantalum and aluminum, for example), and through-hole plating of printed circuit boards (PCBs). Further uses and advantages of the invention are discussed below.

By the term "converted" "solvent exchange", "solvent exchanged" or like words or phrases is meant replacement of some or all of the water associated with the thiophene mixture for a desired exchange solvent (or combination of solvents). Preferably, the replacement of the water is at least about 30% (w/v) complete, more preferably at least about 50% (w/v), even more preferably at least about 90% (w/v) complete, most preferably at least about 99% (w/v) complete with respect to the total volume of water originally present in the mixture. As mentioned, it is an object of the invention to reduce the amount of water present in the thiophene mixture sufficient to replace at least some of that water and sometimes essentially all of the water with a desired volume of the exchange solvent or solvent combination. For many invention applications, substantially complete substitution of the desired solvent or solvent combination for the water in the mixture will be generally preferred.

The invention is fully compatible with a wide range of thiophene mixtures. A thiophene mixture refers to a material that includes at least one optionally substituted mono- or polythiophenes thiophene as disclosed herein which mixture preferably includes water and optionally other components such as, but not limited to, counterions, stabilizers, ect. Preferred are cationically charged monodioxythiophenes and polydioxythiophenes represented by the following formulae I and II:

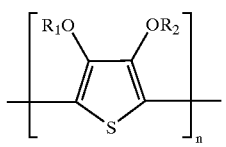

I wherein R1 and R2 each independently represent hydrogen or an optionally substituted C1–C6 alkyl group, or together form an optionally substituted C1–C6 radical, preferably a methylene radical which is optionally substituted by lower alkyl groups, an ethylene-1,2 radical optionally substituted by C1–C12 lower alkyl or phenyl groups, or an optionally substituted cyclohexylene-1,2 radical, n is 1; and the polythiophene is represented by the following formula

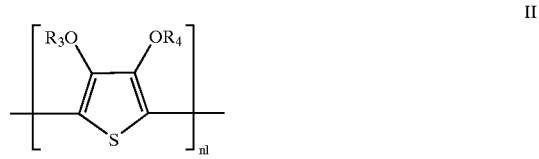

II wherein R3 and R4 each independently represent hydrogen or an optionally substituted C1–C6 alkyl group, or together form an optionally substituted C1–C6 radical, preferably a methylene radical which is optionally substituted by lower alkyl groups, an ethylene-1,2 radical optionally substituted by C1–C12 lower alkyl or phenyl groups, or an optionally substituted cyclohexylene-1,2 radical. Preferably, n1 in Formula II is greater than 1, preferably about 2 to about 10,000, with between from about 5 to about 5000 being preferred for many applications.

By the term "optionally substituted" is meant substitution with hydrogen, substituted or unsubstituted (C1–C18)-alkyl, preferably (C1–C10)-, in particular (C1–C6)-alkyl, (C2–C12)-alkenyl, preferably (C2–C8)-alkenyl, (C3–C7)-cycloalkyl, preferably cyclopentyl or cyclohexyl, (C7–C15)-aralkyl, preferably phenyl-(C1–C4)-alkyl, (C6–C10)-aryl, preferably phenyl or naphthyl, (C1–C18)-alkyloxy, preferably (C1–C10)-alkyloxy, for example methoxy, ethoxy, n- or iso-propoxy, or (C2–C18)-alkyloxy ester. Exemplary substitution groups include halogen, particularly chlorine, fluorine and bromine; lower alkyl, alkenyl, alkynyl, or alkoxy having 1 to 6 carbons, hydroxy, keto, allyl, and sulphonate, for example.

More specific examples of the mono- and polydioxythiophenes have been reported in U.S. Pat. Nos. 5,766,515, 6,083,835, 5,300,575, 6,157,479, EP-A 440 957, EP-A 339, 340; the disclosures of which are incorporated herein by reference. Particular thiophenes of interest may, but do not necessarily include, one or more organic compounds containing dihydroxy or polyhydroxy, and/or carboxyl groups or amide groups e.g., lactam groups are N-methylpyrrolidone, pyrrolidone, caprolactam, N-methylcaprolactam, N-octylpyrrolidone. In embodiments in which such organic compounds are desired, the mono- and polythiophenes will further include sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol. See the U.S. Pat. No. 6,083,635, for example.

In many invention embodiments, the cationically charged monodioxythiophenes and polydioxythiophenes of Formulae I and II above, are each associated with one or more suitable polyanions. Preferred polyanions are the anions of polymeric carboxylic acids such as polyacrylic acids, polymethacrylic acids or polymaleic acids or of polymeric sulphonic acids such as polystyrenesulphonic acids and polyvinylsulphonic acids. These polycarboxylic and polysulphonic acids can also be copolymers of vinylcarboxylic and vinylsulphonic acids with other polymerizable monomers such as acrylic esters and styrene. The anion of polystyrenesulphonic acid is particularly preferred as counterion in most invention embodiments.

The molecular weight of the polyacids providing the polyanions is preferably from 1000 to 2,000,000, particularly preferably from 2000 to 500,000. The polyacids or their alkali metal salts are commercially available, e.g. polystyrenesulphonic acids and polyacrylic acids, or else can be prepared by known methods. Other suitable polyanions include mixtures of alkali metal salts of polyacids and corresponding amounts of monoacids. See the U.S. Pat. No. 6,157,479 and references cited therein.

Additionally preferred thiophenes according to the above Formulae I and II include those in which R1, R2, R3 and R4 each independently represent C1–C4 alkyl or together form a C1–C4 radical. More preferably, the monothiophene is an optionally substituted mono-3,4-alkylene dioxythiophene such as mono-3,4-ethylene dioxythiophene. Also preferred polythiophenes include poly-3,4-alkylene dioxythiophene, preferably poly-3,4-ethylene dioxythiophene.

See also U.S. Pat. Nos. 5,294,372 and 5,066,731 for disclosure relating to other preferred thiophenes including mono- and polydioxythiophenes.

More specifically preferred mono- and polydioxythiophenes according to the invention are Baytron™ formulations (Bayer Corporation, 100 Bayer Rd. Pittsburgh, Pa. 15205-9741). Such polymer formulations are reported to be highly useful in the manufacture of organic conductive polymers. Specific examples of such formulations include, but are not limited to, those designated as M or P formulations. Preferred P type formulations include CPUD2, CPP103T, CPP105T, CPP116.6, CPP134.18, CP135, CPP 4531 I, CPP 4531 E3 and CPG 130.6. A preferred Baytron™ M formulation is a monomer of poly(3,4-ethylenedioxythiophene).

Although it will often be helpful to convert the Baytron™ M to its corresponding polymeric form before practicing the invention, use of Baytron™ M in the methods of this invention is contemplated particularly in cases in which solvent exchanged Baytron™ M formulations are desired. Procedures for converting Baytron™ M to its polymeric form have been disclosed by the Bayer Corporation.

See also the following patent references for additional examples of suitable substituted or unsubstituted thiophene-containing polymers: U.S. Pat. Nos. 4,731,408; 4,959,430; 4,987,042; 5,035,926; 5,300,575; 5,312,681; 5,354,613; 5,370,981; 5,372,924; 5,391,472; 5,403,467; 5,443,944; 5,463,056; 5,575,898; and 5,747,412; the disclosures of which are each incorporated herein by reference.

As discussed, the invention is fully compatible with use of a wide array of solvents and solvent combinations. Generally, choice of an exchange solvent or solvent combination will be guided by recognized parameters including intended use for the converted (solvent exchanged) mono- or polythiophene. A more specific example of such a solvent is one that is stable (ie. does not degrade) to at least about 100° C. at standard temperature and pressure (STP). A preferred solvent boiling point is between from about 100° C. to about 250° C. at STP. Additionally preferred solvents can be fully or partially water soluble or water insoluble as needed. By the term "solvent combination" or like phrase is meant at least two mutually miscible solvents, preferably two, three or four of such solvents.

More examples of suitable solvents include lower alkyl acetamides, lower alcohols including diols and triols, pyrrolidones, lower alkyl pyrrolidones, higher alkyl pyrrolidones, lower alkyl sulfoxides; as well as mixtures thereof. A preferred lower alcohol is glycol or glycerin. Suitable lower alkyl sulfoxides include dimethylsulfoxide (DMSO). Specifically preferred solvents for many invention embodiments are di-methylacetimide (DMAC) and N-methylpyrrolidone (NMP). By the term "lower alkyl" is meant between from about 1 to 20 carbon atoms (branched or straight chain), preferably about 1 to about 10 of such carbon atoms, more preferably about 1 to about 4 of such carbon atoms.

More particular solvents and co-solvents according to the invention will vary e.g., according to intended use. Example of such co-solvents and solvents include, but are not limited to, acetonitrile, benzonitrile, lower alkyl cyanoacetates, preferably methylcyanoacate; halogenated methanes, preferably dichloromethane; diethyl ether, lower alkoxy ethanes, preferably dimethoxyethane; N,N-dimethylformamide, nitrobenzene, nitromethane, propionitrile, and propylene carbonate. By the term "lower alkoxy" is meant methoxy, ethoxy, propoxy, isopropoxy, butyoxy; preferably methoxy. A preferred halogenated methane is partially or fully chlorinated or brominated e.g., dichloromethane and dibromomethane.

One or more of the foregoing preferred solvents can be combined to provide a solvent combination. An illustrative solvent combination would be a mixture of NMP and DMAc, eg., a 50:50 (v/v) mixture of those two solvents. Choice of a particular solvent combination will be guided by intended use of the converted thiophene.

As mentioned previously, the invention is flexible and can be performed by use of one or a combination of strategies. Preferred practice of the invention involves obtaining a suitable solvent or solvent combination and adding that solvent to a vessel. Typically, the exchange solvent or combination is heated in the vessel to a temperature of between from about 100° C. to about 250° C. In most invention embodiments, the vessel conditions further include exposing the solvent to a pressure of about 1 atm, although greater or less pressures may be more suitable for other applications.

Subsequently, about 1 part of the mixture comprising the optionally substituted mono- or polythiophene to at least about 2 parts heated solvent per minute. Preferably, the addition step further includes adding about 1 part of the mixture to between from about 2 to about 10,000,000 parts heated solvent per minute, preferably about 3 to about 100 parts of the heated solvent per minute. Preferred contact between the heated solvent (large volume) and the mixture (smaller volume) moves heat quickly into the mixture sufficient to make the water vapor. In this example of the invention, the larger solvent volume (relative to the mixture volume) facilitates heat transfer to the mixture and production of water vapor.

In a preferred embodiment, it is helpful to collect the water vapor from the mixture as a condensate or distillate separated from the vessel. Preferably, a chamber or trap is used to catch and retain the condensed water vapor. The trap can be configured with a cooling apparatus such as a cooling condenser to assist condensation of the water vapor if desired. In embodiments in which the trap is used, it is possible to measure the amount of water collected, thereby allowing quantitation of the water vapor captured from the mixture entering the vessel. This feature of the invention provides many advantages eg., it allows the invention user to monitor the amount of water removed from the system as the solvent exchange process occurs. Moreover, the user can control the duration and extent of water solvent removal eg., by adjusting the heat of the exchange solvent and/or flow of the mixture into the reaction vessel. Thus, the user can readily quantify solvent replacement by simple inspection of the water collected in the trap. The precise amount of water removed from the mixture as vapor will vary depending e.g., on the intended use for the converted mixture. Preferably, less than about 100% (w/v) of the water is removed from the mixture as vapor, more preferably, between from about 1% (w/v) to about 95% (w/v) of the water is removed.

Specific adaptations of the foregoing methods can facilitate the solvent exchange process.

For example, it will often be very helpful to provide conditions of high sheer mixing between the thiophene mixture and the exchanging solvent. Preferred conditions reduce or prevent agglomeration (congealing) of the Baytron™ P beyond a particle size of about 1 micron. Many Baytron™ P formulations are provided as dispersions in which each particle has a size of about 1 micron. In embodiments in which the high sheer mixing conditions are employed, presence of unsuitably large particles and agglomerates can be reduced or avoided. The converted Baytron™ P formulations can have much better uniformity. A wide variety of mixing implementations can be used to provide such high sheer mixting conditions. Specific examples of such implementations are provided below.

In more specific example of this invention embodiment, the method further includes contacting the heated solvent with at least one non-reactive gas. That gas is typically added to the vessel as a flow or jet stream to facilitate removal of the water solvent from the mixture. Preferably, the gas flow is configured to assist movement of vaporized water toward a chamber or trap as described below. Examples of suitable gases include nitrogen, a noble gas (He, Ar, ect.); or a mixture thereof. If desired, the gas can be pre-heated to about the temperature of the heated solvent to minimize cooling of the solvent in the vessel. The gas can be added to the vessel in several ways including use of a gas pump. The volume of gas introduced into the vessel will vary with intended use but will generally be sufficient to provide for good removal of water vapor from the vessel into the chamber or trap.

After a desired amount of the water is replaced by the exchange solvent or solvent combination, the converted thiophene mixture is collected from the vessel generally as a dispersion. In a particular example of the invention, the dispersion will essentially consist of NMP and Baytron™ P; or DMAc and Bayton™ P. Such dispersions according to the invention are well-suited for the uses disclosed herein including those specific applications intended for Baytron™ formulations. If needed, the solvent exchange methods of this invention can be repeated e.g. one, two or three times, with the already converted thiophene mixture to introduce one or more other desired solvents therein including combinations of the same or different solvents.

A more specific solvent exchange method according to the invention involves exchanging di-methylacetimide (DMAC) or N-methylpyrrolidone (NMP) for water in a colloidal water dispersion that includes at least one poly-3, 4-ethylene dioxythiophene preparation. An example of a preferred preparation is Baytron™, preferably Bayton™ P. In one invention embodiment, the method includes at least one and preferably all of the following steps:

a) heating an amount di-methylacetimide (DMAC) or N-methylpyrrolidone (NMP) in a first vessel to a temperature of between from about 100° C. to about 250° C., b) contacting the heated di-methylacetimide (DMAC) or N-methylpyrrolidone (NMP) with an amount of the colloidal water dispersion comprising water and poly-3,4-ethylene dioxythiophene, wherein the dispersion is added to the surface of the heated solvent at a rate of between from about 0.1 to about 1000 mls/minute, preferably about 1 to 100 mls/minute, more preferably about 10 mls/minute, the contact being sufficient to remove at least part of the water from the dispersion as vapor; and c) exchanging the water removed from the dispersion as vapor with the di-methylacetimide (DMAC) or N-methylpyrrolidone (NMP).

In one embodiment of the foregoing method, that method further includes removing at least part of the water from the vessel as vapor. If desired, that water vapor can be collected or condensed into a second vessel (ie. chamber or trap) that includes at least one co-solvent. The co-solvent can be the same or different from the exchange solvent used in the vessel. In this invention example, the method further includes condensing the water vapor into a second vessel comprising at least one co-solvent.

As mentioned, it is usually desirable to maximize contact between the exchange solvent (or solvent combination) and the mixture comprising the poly-3,4-ethylene dioxythiophene preparation. For example, the ratio of the amount of the di-methylacetimide (DMAC) or N-methylpyrrolidone (NMP) solvent to the amount of the mixture is desirably more than one, preferably between from about 1.5 to about 10,000,000 or more, more preferably between from about 2 to about 10.

In a preferred example of the method, the optionally substituted poly-3,4-alkylene dioxythiophene is obtained as a colloidal water dispersion, preferably also including at least one counter ion. More preferably, the counter ion is polystyrene sulfonic acid and the optionally substituted poly-3,4-alkylene dioxythiophene is poly-3,4-ethylene dioxythiophene. A particular example of such as polydioxythiophene is Baytron™ P.

Particular methods according to the invention involve forming a composition from the mixture, preferably a conductive coating composition therefrom, and subjecting that composition to at least one drying step, preferably after step c) (solvent exchange step) of the methods discussed above. Typically, formation of the composition involves isolating that material from the vessel used to conduct the method, for instance, by filtration, centrifugation and the like.

The invention is compatible with a wide spectrum of drying treatment steps so long as they facilitate production of compositions with at least good resistivity. By the phrase "good resistivity" is meant a resistivity of between from about 0.1 to about 1 (ohm-cm), eg., about 0.2 to about 0.6 (ohm-cm), for compositions having a thickness of between from about 10 nm to about 250 nm, preferably about 40 nm to about 150 nm. Additionally preferred drying treatment steps provide a good surface resistance ie., between from about 100 to about 10, 000 (ohms-sq), preferably about 200 to about 650 (ohms-sq) for compositions having a thickness of between from about 10 nm to about 250 nm, preferably about 40 nm to about 150 nm. Still further preferred drying treatments provide compositions with good optical transmission properties, that is, at least about 70%, preferably at least about 90% between about 300 nm and 600 nm when compared with a suitable control, eg., Baytron-P.

More particular conductive coatings of the invention include at least one of the compositions disclosed herein, typically one, two or three of such compositions, preferably one of same having at least one of the following characteristics. 1) a resistivity of between from about 0.1 to 1 (ohm-cm); 2) a surface resistance of between from about 100 to about 10,000 (ohm-sq); 3) a thickness of between about 10 nm to about 250 nm; and 4) an optical transmission of at least about 90% between about 300 nm and 600 nm wavelengths. More preferred compositions exhibit at least two of such features, even more preferably all three of same.

It will be apparent that it is possible to relate resistivity and surface resistance, particularly for those compositions disclosed herein provided as coating compositions. In general, the relationship between resistivity and surface resistance is defined by the following mathematical formula:

$$\text{Resistivity} = \text{Pie}/(\ln 2) * k * t * (V/I),$$

wherein, V (measured voltage)/I (applied current) is the surface resistance with the unit of ohm/square for the four point probe measurement technique, Pie/(ln 2) is a constant, k is the geometrical correction factor (related to film thickness, probe spacing and sample size) and t is the film thickness.

As discussed, the invention is compatible with a wide variety of suitable drying treatments.

For example, and in one embodiment, the drying treatment includes subjecting a composition of the invention, preferably a coating composition, to a temperature of from between about room temperature (25 C) to about 200 C for less than about a day (24 hours). As mentioned previously, methods of the invention can include, if needed, at least two drying treatment steps the same or different. More specific drying treatments include subjecting the composition to from between about 50 C. to about 150 C. for less than about 12 hours, preferably about 80 C. for less than about 5 hours, typically about an hour or less eg., from about 1 to about 15 minutes.

In a more specific embodiment, the drying treatment includes subjecting the coating composition to room temperature (25 C.) for less about two hours or less followed by treatment at about 80 C. for between from about 1 to about 15 minutes.

Preferably, the composition has a thickness of from between about 50 nm to about 1000 nm, preferably from between about 60 nm to about 750 nm.

As also discussed, the invention also provides compositions made in accord with the solvent exchange methods disclosed herein. An example of such a composition is an optionally substituted mono-3,4-alkylene dioxythiophene or poly-3,4-alkylene dioxythiophene. Preferably, that composition has between from about 1% (w/v) to about 100% (w/v) di-methylacetimide (DMAC) or N-methylpyrrolidone (NMP). Preferably, the he optionally substituted mono-3,4-alkylene dioxythiophene is mono-3,4-ethylene dioxythiophene commercially available as Baytron™ M. Also preferably, the optionally substituted poly-3,4-alkylene dioxythiophene is poly-3,4-ethylene dioxythiophene commercially available as or Baytron™ P.

Preferred compositions according to the invention can also include at least one additive such as those particular additive disclosed previously. An example of such an additive is ferric toluene sulfonic acid (Baytron™ C). Preferably, the ferric toluene sulfonic acid is present in the composition in trace amounts.

In some embodiments, it will be desirable to combine the compositions of this invention with at least one additive. Suitable organic, polymeric binders and/or organic, low-molecular cross-linking agents may also be added to the coating solutions according to the invention. Appropriate binders are described, for example, in EP-A 564 911. Epoxysilanes, such as those provided by the EP-A 564 911 application, can be added to the coating solutions according to the invention, particularly for the production of adhesive layers on glass.

Particular converted polydioxythiophene compositions are preferably used in what is known in the field as a dispersion or solution in a cationic form. That is, a form in which those compositions are obtained, for example, by treating the thiophenes with oxidizing agents. Known oxidizing agents, such as potassium peroxodisulphate are typically used for the oxidation. Also typically, oxidized mono- and polydioxythiophenes acquire positive charges. These charges are not shown in Formulae I and II above, since the number and positions of such charges are not needed to understand and appreciate the invention.

More specific polydioxythiophene compositions according to the invention contain, based on the sum of polythiophene cations and polyanions, that is, based on the total solids content of the solution, from 1 to 100,000% by weight, preferably 10 to 1,000% by weight, of the compounds of Formulae I and II including hydroxy and carboxyl groups. More preferred compositions of this invention are water soluble.

As also discussed, the invention features a wide spectrum of compositions particularly in coating or film formats. Preferred coating compositions include at least one of the foregoing converted (solvent exchanged) optionally substituted polythiophenes, and at least one suitable organic polymer, co-polymer or mixture thereof. Methods for adding such polymers to the converted polythiophenes are known in the field and are exemplified below. Suitable polymers, co-polymers and mixtures include, but are not limited to, polycarbonate, polystyrene, polyacrylates, polyesters such as polyethylene terephthalate, polybutylene terephthalate, polyethylene naphthalate, polyamides, polyimides, optionally glass-fibre reinforced epoxy resins, cellulose derivatives such as cellulose triacetate, polyolefins such as polyethylene, polypropylene. Examples of preferred polyimides for use in preparing the films include TOR-NC (Triton Systems, Inc.), Matrimid (1,3-isobenzofulrandione, 5,5'-carbonylbis-polymer with 1 (or 3)-(4-aminophenyl)-2,3 dihydro-1,3,3 (or 1,1,3)-trim 5-amine) (Ciba); and Aurum (Mitsui Toatsu). The TOR-NC has a chemical structure represented by the following Formula III:

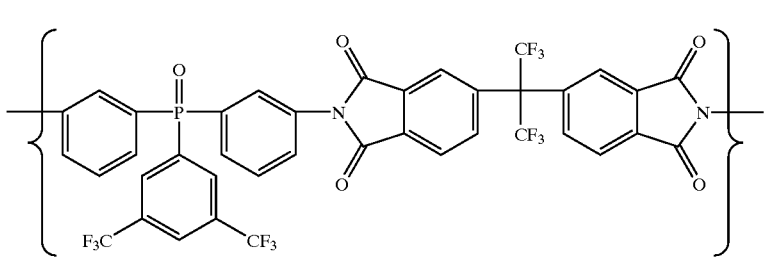

More preferred coatings and films of the invention are conductive and include a weight ratio of at least one of the converted thiophene to the foregoing polymers, co-polymers, graft co-polymers (eg., TOR-NC, Matrimid, Aurum, or a mixture thereof) is about 10:90 to about 0.1 to 99.9, preferably 6:94 to about 0.5:99.5. A preferred film composition is the TOR-NC polyimide and converted Baytron™ P formulation (TOR-CP, see below). Other polyimides and/or polydioxythiophene combinations may be better suited for other applications.

In invention embodiments in which the Baytron™ P polydioxythiophene (or polythiophene made from Baytron™ M) has at least about 90% (w/v) of the water solvent exchanged with NMP or DMAc, preferably at least about 95% (w/v) of the water solvent exchanged with NMP or DMAc, and more preferably at least about 99% (w/v) up to 100% (w/v) so exchanged, the converted Baytron™ formulation will often be referred to herein as TOR-CP (Triton AO Resistant Conductive Polymer made from Baytron™ P).

More preferred coating films made from TOR-CP include between from about 0.5% (w/w) to about 5% (w/w) of the TOR-CP relative to the polyimide of interest, preferably between from about 1% (w/w) to about 4% (w/w). See the Examples below as well as the Drawings.

Preferred coating materials of the invention include from about 1 mg/m$^2$ to about 500 mg/m$^2$ of at least one of the compositions of this invention including TOR-CP exchanged with NMP or DMAc. The TOR-CP can include one or more polyimides of interest including at least one of Matrimid and TOR-NC. Of course, other compositions as disclosed herein may be more suitable for other applications. Additionally preferred coating materials have an optical density of between from about 0.0001 to about 0.05 at between from about 300 nm to about 700 nm. Also preferred are those coating materials that exhibit light transmission of between from about 10% to about 95% or more, preferably 80% to about 99% or more as measured by a BYK Gardner Haze-gard plus machine. Such coating compositions will often further include at least one additive as described previously. Coating compositions having a light transmission greater than about 80% will often be preferred in many optical applications.

The compositions of this invention including preferred conductive films and coatings can be produced by reference to recognized processes disclosed in U.S. Pat. Nos. 5,766, 515, 6,083,835, 5,300,575, and 6,157,479. Preferred production processes involve, for example, spraying, application by a doctor blade, dipping, application with roller applicator systems, by printing processes such as gravure printing, silk screen printing, curtain casting, and can be dried at room temperature or at temperatures of up to 300° C., preferably up to 200° C. Suitable substrates are transparent substrates such as glass or plastic films (e.g. polyesters, such as polyethylene terephthalate or polyethylene naphthalate, polycarbonate, polyacrylate, polysulphone or polyimide film).

The invention has other applications as well. For example, the compositions, films and coatings disclosed herein can be used to coat some or all of an organic or inorganic fiber or related substrate. Illustrative of such fibers include those made whole or in part from Kevlar™ (aramide), polyethylene, PBO (poly-benzoxazol), polyester, nylon, polyamide, glass; as well as combinations thereof. Preferred fibers are about 0.5 to 50 deniers, preferably about 1 to about 10 deniers. Application of the invention compositions, films and coatings will help improve the electrical conductivity of the fibers.

The invention is also compatible with techniques for making spin-coated filaments, particularly monofilaments, by electrospinning. See Reneker, D. H. *Nanometer Diameter Fibres of Polymer Produced by Electrospinning,* Fourth Foresight Conference on Molecular Nanotechnology.

For some applications, it will be useful to anneal the films and coatings e.g, to increase electrical conductivity. Methods for annealing a wide variety of suitable films and coatings have been disclosed in the U.S. Pat. No. 6,083,635, for example.

The coatings and films of this invention can be used in a variety of thicknesses depending, eg., on intended use and desired transparency and conductivity parameters. A preferred thickness is from about 0.005 to about 500 μm, preferably from about 0.05 to about 10 μm. Preferred conductive coating materials of this invention can be configured as a layer having a surface resistance of between from about $10^0$ to about $10^{12}$ Ω/sq. Additionally preferred are coatings featuring a surface resistance of from about 0.1 to about 2000 Ω/sq, preferably from 1 to 300 Ω/sq.

As disclosed herein and in the prior provisional application 60/269,606 filed on Feb. 16, 2001, a wide spectrum of organic solvent-based conducting polymer systems, particularly TOR-CP™ has been provided. Tor-CP is PEDET:PSS based organic solvent systems, such as NMP, which has a very low water content of less than 3% water. The present invention is further investigation of the Tor-CP-based coatings for the electro-optic device applications. Electrical resistivity measurement results indicated that coatings produced using Tor-CP exhibited higher electrical conductivity than that of the state-of-the-art conducting polymer systems such as PEDET:PSS supplied by Bayer AG (trade name Baytron-P). Furthermore, optical transparencies of the coatings using Tor-CP are similar to that of the Baytron-P. In addition, resulting coating are very stable in the ambient laboratory atmosphere. Applicants have not observed any degradation of coating properties during exposure to unprotected ambient atmosphere longer than one month. During the same period, coatings prepared using the Baytron-P and stored in the same environment degrades (seriously softened), probably due to reaction with moisture.

Excellent electric conductivity, high optical transparency and environmental stability of the coatings from Tor-CP suggest that Tor-CP is an ideal candidate material for many electro-optic device applications. Furthermore, low water contents in the Tor-CP will provide additional benefit of ease-of manufacturing of electro-optic devices that contain ITO electrodes. In addition, non-acidic and non-hygroscopic natures of the coatings from Tor-CP further suggest a long lifetime or less performance degradation of the devices fabricated using Tor-CP. The unique properties of the coatings from Tor-CP further suggest that present transparent electrodes of ITO can be replaced by coating from Tor-CP for a certain applications. In such case, all organic material based electro-optic devices can be realized, including flexible plastic (or polymer) substrates that will significantly reduce manufacturing costs of many electro-optic devices and provide opportunities of producing advanced electro-optic devices that requires flexible substrates.

Furthermore, the electric conductivity of the Tor-CP coatings can be significantly increased without degrading the optical transparency by employing specially designed coating fabrication processes.

The conductive films and coatings according to the invention find use in a wide range of applications requiring good electrical conductivity e.g., as electrodes in electroluminescent displays, in LCD displays, in solid electrolyte capacitors, for the deposition of metals such as copper, nickel, for example, in the manufacture of printed circuits, in solar cells, in electrochromic displays or for the screening of electromagnetic radiation or for leading away electrical charges, for example, in picture tubes or as anticorrosive coatings on metals, for the production of touch screens. Other areas of application are systems for picture production, for example, silver halide photography, dry-plate systems, electrophotography.

The conductive coatings and films of the invention are well-suited for optional coating with further layers such as those reported in the U.S. Pat. No. 6,083,635, for example.

Also provided by the present invention are articles of manufacture that include or consist of at least one of the compositions disclosed herein. Examples of such articles include, but are not limited to, an antiradiation coating, antistatic coating, battery, catalyst, deicer panel, electrochromic window, electrochromic display, electromagnetic shielding, electromechanical actuator, electronic membrane, embedded array antenna, fuel cell, infrared reflector, intelligent material, junction device (PV), lithographic resist, non-corrosive paint, non-linear optical device, conductive paint, polymer electrolyte, radar dish, redox capacitor, sealant, semiconductor circuit, sensor, smart window, telecom device, waveguide, or wire (low current). Preferably, the electromechanical actuator is one of a biomedical device, micropositioner, microsorter, microtweezer, or microvalve. Also preferably, the sensor is one of a biological, chemical, electrochemical, irradiation dosage, mechanical shock, temperature, temperature limit, or time-temperature sensor.

As discussed, many electro-optic devices, such as light emitting diodes (LED's) and photovoltaic cells, require electrically conductive and optically transparent films/coatings as electrode materials. Presently, transparent electrodes in electro-optic devices are made of ITO coated glass substrates. ITO has, however, several crucial shortcomings. Its manufacturing processes involve a relatively cumbersome and costly technology, such as vacuum deposition in a controlled gas atmosphere. Furthermore, due to brittle-nature of the ITO films, it is difficult to prepare the ITO films on large area substrates or flexible substrates.

Currently, transparent conducting polymers and their coatings are considered the best candidate material as a hole injection layer in organic light emitting diodes (OLED's). In this application, a thin layer (less than 20 nm thickness) of transparent conducting polymers is deposited by employing a solution film casting process, such as a spin-coating method, onto the ITO coated substrate. As previously mentioned, the ITO layer is deposited onto the rigid substrate, such as glass, via a vacuum deposition process. Since the ITO is very sensitive to moisture and other acid based chemicals, fabricating a hole injection layer on top of ITO requires cumbersome processes and serious limits the selection of substrate materials.

Although electrically conductive and optically transparent coatings have been successfully produced using polyaniline (PANI) containing solution (U.S. Pat. No. 5,618,469) and PEDET/PSS polymer dispersion (Eur Patent 686662), these prior art inventions have serious limitations in manufacturing practical electro-optic devices. For example, it is well known that the PANI systems are not stable and, therefore, it's device performance degrades rapidly over time. Performances of the carefully fabricated PEDET:PSS-based devices are known to be stable in use. However, currently available PEDET/PSS polymers are an aqueous based system. Therefore, fabricating PEDET:PSS coatings onto ITO coated substrates requires cumbersome manufacturing processes. Further hydrophilic nature of the PEDET:PSS system attracts moisture, even through the protective moisture barrier, and can induce premature failure of the devices during use.

As mentioned previously, additional articles of manufacture in accord with the invention include or consist of at least one electro-optical implementation eg., one, two, three or more of same. Preferred implementations include organic light emitting devices (OLEDs), electro-optical switches, photovoltaic cells and the like.

In preferred embodiments, the OLED includes at least one and typically all of the following components operatively linked together: 1) metal cathode; 2) electron transport layer (ETL); 3) organic emitter; 4) hole injection layer (HIL); and 5) a glass substrate layer. Optionally, the OLED further includes an indium doped tin oxide (ITO) anode operatively linked to the same. A representation of such an OLED structure has been reported by Cropper, A. D. et al. in *Organic Light-Emitting Materials and Devices IV*, Kafafi, Z. H. Editor, Proceedings of SPIE, Vol. 4105 18–29 (2001). See FIG. 2 of Cropper, A. D. et al. entitled "OLED basic structure" in particular. By the phrase "operatively linked together" is meant association of such components in a configuration necessary to achieve suitable functionality of the OLED.

It is an object of this invention to replace the ITO of the OLED with at least one of the compositions disclosed herein, preferably one of the conducting compositions. This feature of the invention provides advantages including better performance characteristics, especially improved conductivity and optical transparency. Preferred OLEDs of the invention will include at least one of the compositions disclosed herein provided as the hole injection layer (HIL). An especially preferred OLED includes TOR-CP as the HIL.

In a more particular example of the invention, the OLED has a peak external quantum efficiency of between about 0.02% to about 0.2%, preferably when such OLED is operated between from about 4 to about 8 volts.

Additionally preferred OLEDs of the invention have a peak power efficiency of between from about 0.5 to about 2 lm/W at an applied bias of between from about 1 to about 8 volts.

Still further preferred OLEDs have a luminance of between about 7000 to about 9000 cd/m$^2$. Preferably, the OLED has a maximal luminance of between from about 10,000 to about 50,000 cd/m$^2$ at about 4 to about 8 volts.

As mentioned the invention also provides suitable methods for making an electronic implementation by writing or printing manipulations. Preferably, such methods are performed repetitively or semi-repetitively e.g., as when at least step a) is repeated at least once. In a particular method steps a), b) and c) are repeated twice or more to print or write the electronic implementation.

In other preferred embodiments of the method, the hole (via-hole or interconnect) produced by dissolution of the first polymer layer by the exchange solvent in the composition includes a first end contacting the first polymer layer and a second end contacting a substrate layer. That hole is substantially filled with the composition according to the method, preferably with the assistance of a conventional ink-jet printer. One suitable ink-jet printer includes at least two nozzles for dispersing the composition of the invention, each nozzle comprising the same or different composition as needed. Preferably, at least one of the compositions comprises poly(3,4-ethylenedioxy-thiophene) which composition may further include polystryene sulfonic acid (PEDOT/PSS). A more preferred composition for use with the method for making the electronic implementation is Baytron™-P or a suitable polymer of Baytron™-M.

In one embodiment of the method for making the electronic implementation, the first polymer layer comprises or consists of a dielectric polymer e.g., polyvinylphenol, polyimide and polycarbonate. Preferably, the substrate layer is insoluble in the solvent of the composition. An exemplary substrate is glass.

In another invention example, the electronic implementation produced by the method is an inverter capable of converting a high-voltage input to a low-voltage output; or a low-voltage input to a high-voltage output. Methods for making and using inverters have been described. A more preferred inverter is a component of an electronic circuit which circuit comprises at least one source electrode and at least one drain electrode. Typically, such electrodes are separated from each other by about 1 to 10 micrometers. See e.g. Dagni, R. in *Chemistry and Engineering*, Jan. 1, 2001, pp. 26–27 as well as references cited therein.

The invention methods can also be used to make useful electronic circuits having a preferred output of between from about −20V to about 0V. Additionally useful electronic circuits have as an input between from about 0V to about −20V. Methods for making and using electronic circuits have been described. See e.g., the website at plasticlogic.com as well as references cited therein, the disclosure of which is incorporated herein by reference.

As mentioned, the invention also provides articles of manufacture that include the electronic implementations of this invention. Exemplary articles include a liquid crystal display, electrophoretic ink display, polymer disperse liquid crystal (PDLC) or an identification tag such as a smart label adapted for use in consumer good. Particular examples of such consumer goods includes a toy or supermarket item.

In particular invention embodiments, electrically conductive and optically transparent organic solvent based polymer coatings are provided. Also provided are methods for the preparation of the same for applications of which flexibility and environmental stability are of an important consideration.

In addition, the present invention also relates to a method for preparing coatings of organic solvent based poly (ethylenedioxythiophene):poly(styrene sulfonic acid) (PEDT:PSS) conducting polymers for improved properties, such as electrical conductivity, of the resulting coatings for use in electro-optic devices comprising transparent electrodes which are made of same. In this embodiment the organic solvent-based polymeric system does not have compatibility problems with the state-of-the-art transparent conductive layer of indium doped tin oxides (ITO). Therefore, manufacturing processes of electro-optic devices can be easier. Furthermore, high conductivity and optical transparency of the resulting films from the organic solvent based conducting polymer system suggest a possibility of replacing the ITO layer in many electro-optic device applications such as organic light emitting diodes (OLED's), photovoltaic cells, electro-optic switches, etc.

As shown in the Example 8, below, a thin layer (less than 20 nm thickness) of transparent conducting polymers is deposited by employing a solution film casting process, such as a spin-coating method, onto the ITO coated substrate. As previously mentioned, the ITO layer is deposited onto the rigid substrate, such as glass, via a vacuum deposition process. Since the ITO is very sensitive to moisture and other acid based chemicals, fabricating a hole injection layer on top of ITO requires cumbersome processes and serious limits the selection of substrate materials.

Additionally preferred conductive coatings in accord with the invention feature a surface resistance of between about 10 ohm-sq to about 1000 ohm-sq when spin-coated in less than about 10 layers, preferably less than about 5 of same, more preferably about 1, 2 or 3 of such layers. Preferred spin-coated layers are less than about 10 mil thick, more preferably about 5 mil thick although thinner layers may be more appropriate for some invention applications.

Further preferred conductive coatings have a light transmittance of at least about 80%, preferably greater than about 85%, more between from about 86% to about 95% as determined by conventional procedures disclosed herein. Additionally preferred conductive coatings exhibit such favorable light transmission properties when spin-coated in less than about 10 layers, preferably less than about 5 of same, more preferably about 1, 2 or 3 of such layers. Preferred spin-coated layers are less than about 10 mil thick, more preferably about 5 mil thick although thinner layers may be more appropriate for some invention applications. Such preferred conductive coatings have a wide variety of applications including use as an anode electrode. See Example 9 and FIGS. 14—14, for instance.

In embodiments in which the anode electrode includes (or consists of) one or more of the conductive coatings disclosed herein, such an electrode will feature a surface resistance of less than about 5 kohm-sq, preferably less than about one kohm-sq to about two kohm-sq. Additionally preferred electrodes have an optical transmission of at least about 85%.

Additionally preferred conductive coatings in accord with the invention exhibit favorable resistivity and conductivity when featured on an Ln-Ln conductivity graph. See Example 10 and FIGS. 16 and 17. Particular coatings exhibit at least about 1 Ln-sigma (S/cm), preferably between from about 1 Ln-sigma (S/cm) to about 10 Ln-sigma (S/cm), more preferably between from about 1 Ln-sigma (S/cm) to about 4 Ln-sigma (S/cm). Further preferred conductive coatings feature such good conductivity at high temperatures of between from about 0.01 Ln-Temp ($K^{-1/2}$) to about 0.2 Ln-Temp ($K^{-1/2}$).

Still further preferred conductive coatings do not exhibit what is known as a "kink", particularly between about 0.05 Ln-Temp ($K^{-1/2}$) to about 0.1 Ln-Temp ($K^{-1/2}$), preferably between from about 0.06 Ln-Temp ($K^{-1/2}$) to about 0.08 Ln-Temp ($K^{-1/2}$). See Example 10 and FIG. 17.

Additionally preferred conductive coatings of the invention exhibit good conductivity ie., at least about 1 Ln-sigma (S/cm), between from about 0.1 Ln-Temp ($K^{-1/4}$) to about 0.5 Ln-Temp ($K^{-1/4}$), preferably from about 0.2 Ln-Temp ($K^{-1/4}$) to about 0.35 Ln-Temp ($K^{-1/4}$). Also preferred are conductive coatings that do not exhibit the "kink" between about 0.2 Ln-Temp ($K^{-1/4}$) to about 0.4 Ln-Temp ($K^{-1/4}$), preferably between from about 0.24 Ln-Temp ($K^{-1/4}$) to about 0.3 Ln-Temp ($K^{-1/4}$). See Example 10 and FIG. 17.

The following examples are provided to point out preferred aspects of the invention and are not intended to be indicative of the scope of the invention.

EXAMPLE 1

Solvent Exchange Process for Making TOR-CP/NMP

The following are preferred processes for making TOR-CP using N-methylpyrrolidone (NMP) as the exchange solvent.

A. Method 1
1. Place the Ace Glass 22L RB 4 neck flask into the Glas-Col heating mantle canister
2. Take the Ace Glass 19 mm stir shaft w/teflon paddle assembly and place into the center neck of the 22L RB flask, followed by the teflon lined stirrer bearing 3. Attach the stirrer shaft to the chuck of the Arrow 850 stirrer motor
4. Hookup the SGA variac controllers to the Glas-Col heating mantle canister
5. Attach the Dean Stark Trap to the left neck of the 22L flask, then place the Ace Glass 300 mm coil condenser on top of it. A tube will then run from the top of the condenser to the nitrogen bubbler.
6. In the right neck of the 22L flask, place the teflon coated temperature probe and the nitrogen line supplied by the Gilmont instruments flowmeter.
7. Into the front neck of the 22L RB flask, charge with 10,504 ml of NMP (water miscible solvent as described above)
8. Turn on the SGA variacs and heat the solvent to 135 C under agitation from the Arrow 850 stirrer motor. The stirrer setting (rpm) should not need to be changed throughout the remainder of the process
9. Set the Gilmont Instruments nitrogen flowmeter to produce a steady flow of nitrogen through the flask until it comes out the bubbler
10. Using the Watson-Marlow peristaltic pump, begin pumping 3000 ml of Baytron P into the 22L RB flask at a flow rate of 10 ml/minute
11. Continue pumping the Baytron P into the reactor vessel until complete (approx. 3 hrs)
12. As the Baytron P is being fed into the reactor, water should start condensing and collecting in the Dean Stark trap
13. At this point, adjust the nitrogen flow meter to increase the nitrogen flow considerably, forcing the water vapor up into the coil condenser
14. The water will start to rapidly condense and collect in the Dean Stark trap. Drain the trap as needed.
15. Continue this process until the desired amount of water has been removed.
16. Shut of the variacs, continue the agitation and the nitrogen flow until the product in the flask has cooled to RT
17. Remove from product from the flask B. Method 2

As discussed, it will often be helpful to provide conditions of high sheer mixing between the thiophene mixture and the exchanging solvent. Such conditions can facilitate a reduction in particle agglomeration and provide for better product uniformity. High sheer mixing can be readily practiced by replacing the 4 neck flask in Method 1 (step 1) with a five neck flask. Between steps 7 and 8, for example, the reagents can be subjected to high sheer mixing by using a standard homogenizer or disperser. A preferred homogenizer is a Model #T 25 Ultra-Turrax Disperser/Homogenizer (IKA-Works). Optimal use of the homogenizer will keep Baytron P particles from agglomerating as determined eg., by inspection.

EXAMPLE 2

TOR/CP Conductive Coatings

Three types of conductive coatings have been made using the solvent exchange process of this invention.

A. TOR-CP Spin-Coating

A conductive coating was made from the solvent exchanged TOR-CP/NMP (neat) composition prepared as described above in Example 1. Specifically, the composition was spin-coated onto a glass substrate using conventional procedures. Conductivities were measured with a Keithly 200 4 point probe.

FIG. 1 shows light transmission and surface resistance data when TOR-CP (unfiltered), TOR-CP (filtered), and Baytron-P converted products were tested. As can be seen from FIG. 1, coatings made from the TOR-CP have better light transmission and lower surface resistance then the Baytron-P coating. FIG. 1 was prepared from measurements made of TOR-CP (neat) dispersion cast onto glass. Although this is technique is suitable for some applications, it will often be useful to combine the TOR-CP with other components and particularly at least one polymer, co-polymer, polymer blend, ect. In many instances, the resulting film or coating will have better performance characteristics when compared to TOR-CP alone.

B. TOR-CP Draw Down Coatings

Standard draw down techniques were used to apply the TOR-CP to a glass substrate. Such techniques have been described e.g, by Erichsen. Specifically, the Erichsen Testing Equipment product brochure describes such techniques.

This composition was coated onto glass substrates using an Erichsen Model 360 film application. Wet film thickness of 120 microns was applied and the dry film thickness for the TOR-CP samples was between 0.3 to 0.5 microns. See FIG. 6.

Additional drawdown coatings using the Baytron™ P product were made in order to compare the surface resistance to each other. The surface resistance measurement was made by applying silver electrodes to the coating using IEC standard 93 (VDE 03003) and measuring resistance with an ohmmeter. The resulting resistance was expressed as ohms/sq. See FIG. 6.

It is significant that the surface resistance of the TOR-CP coatings was up to two orders of magnitude less resistive (ie. more conductive) than similar Baytron™ P coatings. This indicates that the conversion (solvent exchange) process boosts the conductivity of the base conductive polymer in an unexpected way and significantly improves the performance of the resulting TOR-CP material.

See also FIGS. 7A, 7B, and 7C (showing data from selected samples of Baytron™ P exchanged with NMP or DMAc). Drawdown surface resistances are also illustrated.

C. Formulated TOR-CP Coatings

Formulated TOR-CP coatings according to the invention can be applied using spin-coating or draw down procedures.

One method for making a formulated conductive coating is as follows. Referring to Table 1, below, listed components were combined (wt % ratios) and mixed in the order given. Mixing under constant agitation was preferred.

TABLE 1

| Component | Manufacturer | % by Weight |
| --- | --- | --- |
| TOR-CP | Triton Systems | 45 |
| Silquest A 187 | Witco Surfactants GmbH | 0.86 |
| Isopropanol | | 53.84 |
| Bayowet FT 229 | Bayer Corp | 0.30 |
| Total | | 100 |

A coating made by this method can be applied to substrates using standard spin coating or draw down coating techniques. See sections A and B, above. The coating was prepared in a glass vessel with paddle stir mechanism.

FIG. 8 shows surface thickness and resistance for several TOR-CP formulated drawdown coatings. The results show favorable conductivity using this coating method.

EXAMPLE 3

Conductive TOR-CP Films with Polyimide

Conductive polyimide films have been manufactured by adding dry polyimide powder to TOR-CP converted (ie. solvent exchanged) solution. See Example 1, above. Typically, the polyimide powder and TOR-CP converted materials are mixed. A preferred weight ratio between the polyimide polymer and conductive polymer ranges from 94:6 to 99.5:0.5.

A more specific method for making the film is as follows. A starting quantity of TOR-CP dispersion is weighed. The total conductive polymer solids amount is determined by multiplying the total dispersion weight by the solids content of the dispersion. Polyimide is added to the solvent dispersion so that the final weight ratio of the solids conductive polymer to polyimide is either 0.5/99.9, 1.0/99 or 2.5/97.5. The polyimide is added to an agitated TOR-CP keeping agitation with a magnetic stir bar.

Figure 2:
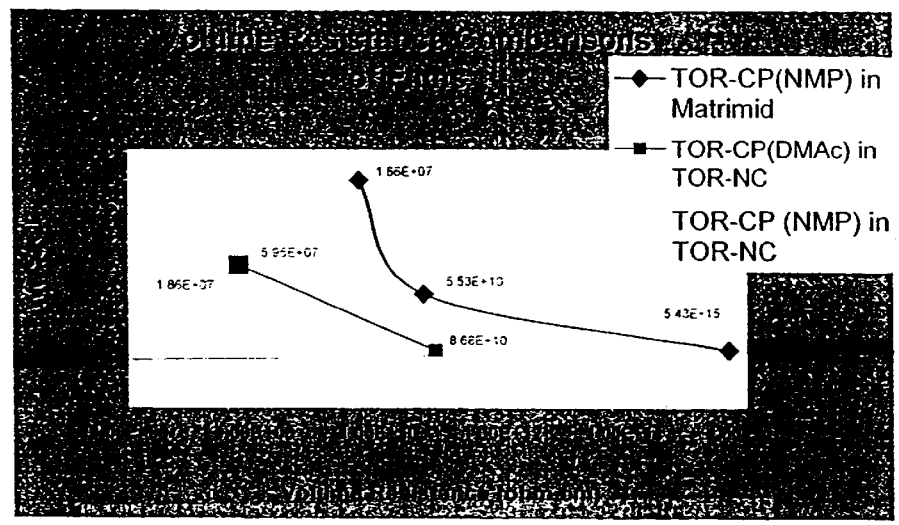
FIG. 2 is a graph showing volume resistance comparisons of TOR-CP exchanged with N-methylpyrrolidone (NMP) in Matrimid™ (Ciba) as polyimide; TOR-CP exchanged with di-methylacetimide (DMAC) in TOR-NC (Triton AO Resistant polyimide); and TOR-CP exchanged with NMP in TOR-NC.
Figure 3:
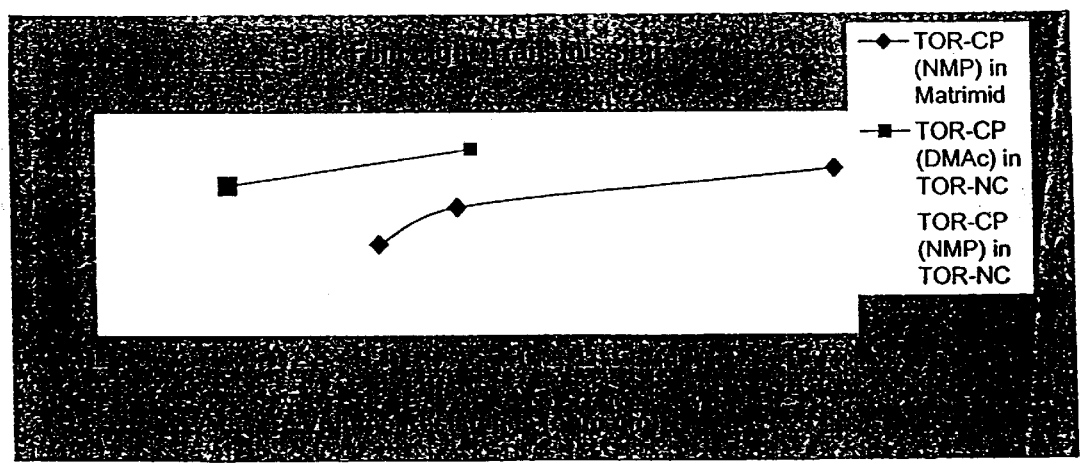
FIG. 3 is a graph showing bulk film light transmission versus volume resistance for the polymers described in FIG. 2, above.

Volume conductivity (ohm-cm) has been measured for films that contain 1, 2.5 and 4% conductive polymer respectively. FIGS. 2 and 3 show measurements made on blends that contain the Triton AO resistant polyimide (TOR-NC) and a commercial polyimide from Ciba called Matramid.

EXAMPLE 4

Analysis of Converted (Solvent Exchanged) Baytron™ P Batches

To better appreciate the performance characteristics of Baytron™ P formulation converted according to the invention, the following parameters were analyzed: conductivity, viscosity, solids content, particle size and distribution, light transmission, pH value, density and water content. Analyses were performed according to recognized procedures. See FIGS. 4 and 5 ("MAV" numbers refer to specific Baytron™ P batches).

Referring now to the particle size analysis of FIGS. 4 and 5, the data shows an average particle size ranging from <1 micron to >30 micron. Specifically shown by FIGS. 4 and 5 are particle analysis of three of samples, and then a summary sheet showing several properties we are monitoring. Particle Size analysis was done by Micromeritics in Norcross Ga. The technique used is called Eltone™ particle size analysis.

FIG. 6 shows conductivity measurements using Baytron™ P (neat) and batches of converted (solvent exchanged) Baytron™ P (MAV 92–96, 83–86 and 77). Resistances were measured according to standard procedures. The data show that the converted Baytron™ P formulations exhibited an increase in conductivity (decreased resistance) of about two to three orders of magnitude. Significantly, it has been found that the conductivity increase of the converted Baytron™ P formulation can be achieved with a film thickness up to about half that of the neat formulation.

EXAMPLE 5

Process for Making Conductive Films Useful in Antistat Applications

It is possible to combine the converted (solvent exchanged) TOR-CP solutions of this invention with a wide spectrum of suitable polymers e.g., polyimide, polycarbonate, epoxies, polyarylene ethers, polyester, PEN, and other solution processed polymers, using conventional film processing methods such as those disclosed herein. More specific examples of such polymers can be found in the *Modern Plastics Encyclopedia* Vol. 75, No. 12 (Mid-November 1998 issue). Suitable procedures for blending the polymers and conductive polymer solution (TOR-CP) are known in the field including simple weight measurements, room temperature stirring, etc.

Two more specific methods for making the films are as follows.

A. Method 1

First, make a solution that essentially dissolves various polymer into the TOR-CP dispersion. Nearly any polymer that is soluble in the NMP solvent could be used such as polyimide, polyesters, polyurethanes, polycarbonates, polysulfones, polyetherimides and the like. In one application, polymer was added to an agitated TOR-CP dispersion so that the ratio of conductive polymer to added polymer is in the range of 0.5% to 3% by weight. The solvent (NMP) content was then adjusted to bring the total solids content (conductive polymer/dopant plus non-conductive base polymer) to approximately 18%–22% by weight. The mixture was stirred until a homogeneous honey like consistency is achieved. The blended solution was then filtered through a 12 micron filter and cast onto a substrate using a drawdown bar, or lip casting process. The substrate was then passed through a heating section to drive off the NMP solvent at about 150 C. for 10–30 minutes depending on whether this is a continuous or batch process. This process has been practiced in both batch and continuous methods and various data has been collected.

B. Method 2

Another way to incorporate TOR-CP would be dependent on ability to convert the water based Baytron P into a high molecular weight polymer instead of into a solvent. A particular material of interest is polybutene (BP Amoco). Assuming the conductive polymer can be incorporated into the polybutene at about 50% concentration, then it will be possible to let that mixture down into polyolefins during a melt processing operation. This could then open up the possibility of making conductive polyethylene, or polypropylene with a much lower cost melt processing technique. The temperatures for processing this combination must be kept below 200 C. to prevent degradation to the conductive polymer dopant and this would be the case with polyolefins.

A preferred film produced by either of the foregoing specific methods is free standing and has a conductivity through the thickness (instead of just at the surface) which can be from <1 mil to >5 mils thick (1 mil=0.001"). The volume resistance ranges from $10^4$–$10^{12}$ ohm-cm depending, for example, on the weight concentration of the conductive polymer. Particular applications for such films include antistatic packaging materials, electrostatic discharge (ESD) and electromagnetic interference (EMI) shielding films.

The following materials were used, as needed, in the foregoing Examples unless specified otherwise.

22L Round Bottom 4 neck Flask (Ace Glass)
Glas-Col Heating Mantle Canister
SGA Variac Controllers
19 mm Glass Stir Shaft w/teflon paddle assembly (Ace Glass)
19 mm Teflon Lined Stirrer Bearing (Ace Glass)
Watson-Marlow Peristaltic Pump model #505DU
Arrow 850 Stirrer Motor w/chuck
300 mm Coil Condenser (Ace Glass)

325 ml Dean Stark Trap (Aldrich)
Teflon Coated Temperature Probe w/digital read
Gilmont Instrument Nitrogen Flowmeter
Nitrogen Bubbler
Model #T 25 Ultra-Turrax Disperser/Homogenizer (IKA-Works)

EXAMPLE 6

Preparation of Polymer Coating Layers

Table 2, below, shows a list of representative coatings produced during the course of the present invention. Baytron-P, an aqueous based PEDET:PSS conducting polymer manufactured and supplied by Bayer AG was used as a reference throughout the experiments. Tor-CP and Baytron-P coatings were fabricated by employing a spin-coating method with a 2000 rpm spin speed. Two and a half inch diameter and $1/16$ inch thick borosilicate glass disks were used as substrates throughout the experiments. Thickness of the final coatings was controlled by applying multiple spin-coating operations with the same spin speed and duration of spin of 10 seconds. After each spin coating, polymer coating/substrate combinations were dried by employing two different drying methods as described in Table 2: (1) oven dry at 80° C. for 5 minutes and (2) dry at ambient temperatures for 60 minutes followed by oven dry at 80° C. for 5 minutes. All dried samples were stored in the sealed plastic bags before electrical conductivity/resistivity and optical transmission/absorbance measurements.

More particularly, for spin-coating, the glass substrate was mounted on the vacuum chuck of the spinner and 1.5 mL of Tor-CP or Baytron-P solutions are applied in the middle of the substrate, followed by start spinning with the preset speed of 2000 rpm and duration of 10 seconds. Specific batch No. of the Tor-CP was KAC79 and 0.6% solid content in NMP solvent. Baytron-P is 1.3% solid content in water solvent.

Thickness of the coating was measured using a stylus surface profilometer.

TABLE 2

Representative Coatings and Preparation Conditions

| Coating ID | Conducting Polymers | Coating Thickness (nm) | Drying Conditions |
| --- | --- | --- | --- |
| Baytron-P-O1 | Baytron-P | 120 | 80 C. oven drying for 5 minutes |
| Baytron-P-O2 | Baytron-P | 314 | 80 C. oven drying for 5 minutes |
| Baytron-P-O3 | Baytron-P | 592 | 80 C. oven drying for 5 minutes |
| TOR-CP-O1 | TOR-CP | 52 | 80 C. oven drying for 5 minutes |
| TOR-CP-O2 | TOR-CP | 105 | 80 C. oven drying for 5 minutes |
| TOR-CP-O3 | TOR-CP | 171 | 80 C. oven drying for 5 minutes |
| TOR-CP-A1 | TOR-CP | 70 | RT air dry for 60 minutes and followed by 80 C. oven drying for 5 minutes |
| TOR-CP-A2 | TOR-CP | 107 | RT air dry for 60 minutes and followed by 80 C. oven drying for 5 minutes |

Figure 9A:
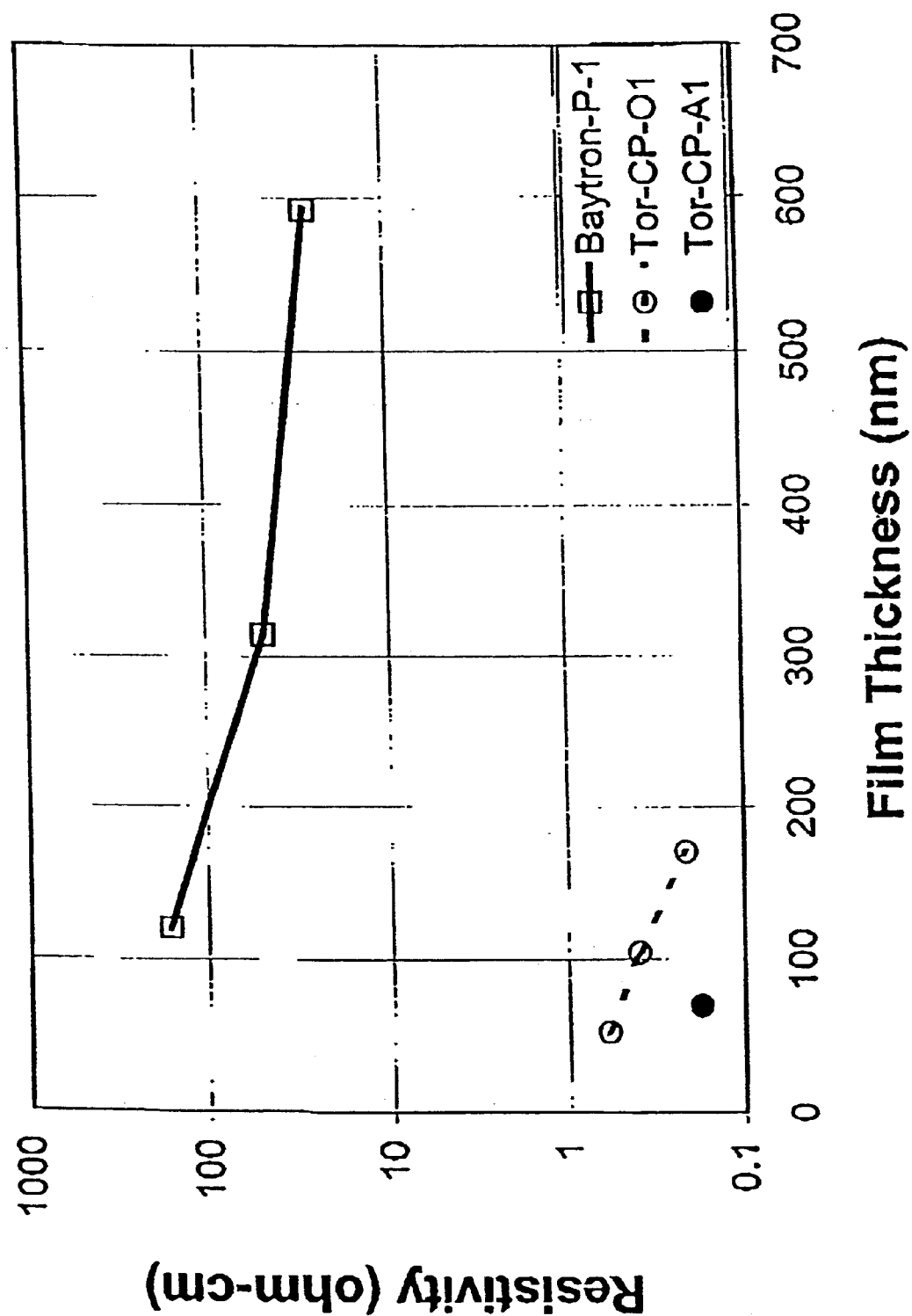
FIGS. 9A–D are graphs showing resistivities of spin-coated films of TOR-CP and Baytron-P on glass substrates as a function of coating thickness.
Figure 9B:
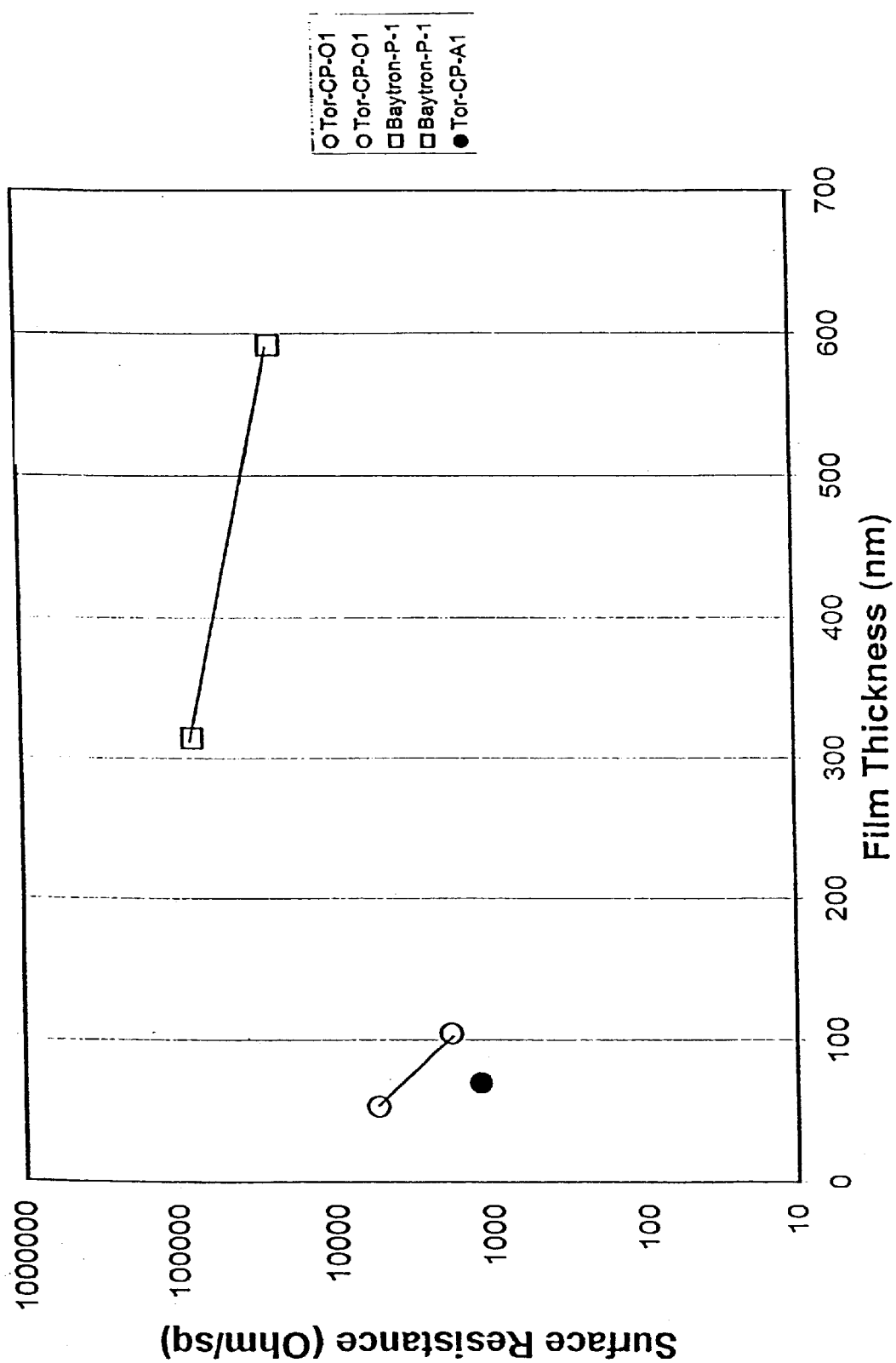
Figure 9C:
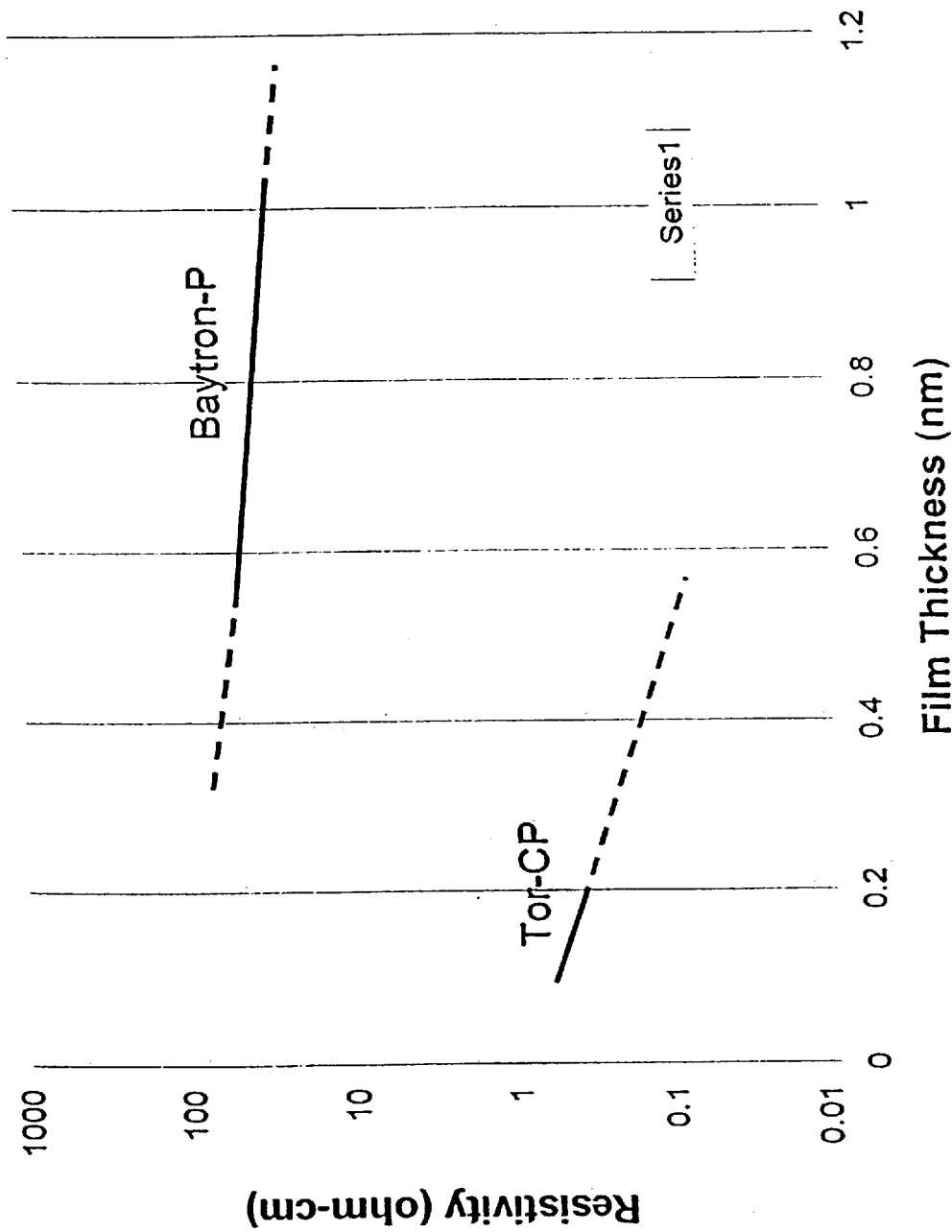
Figure 9D:
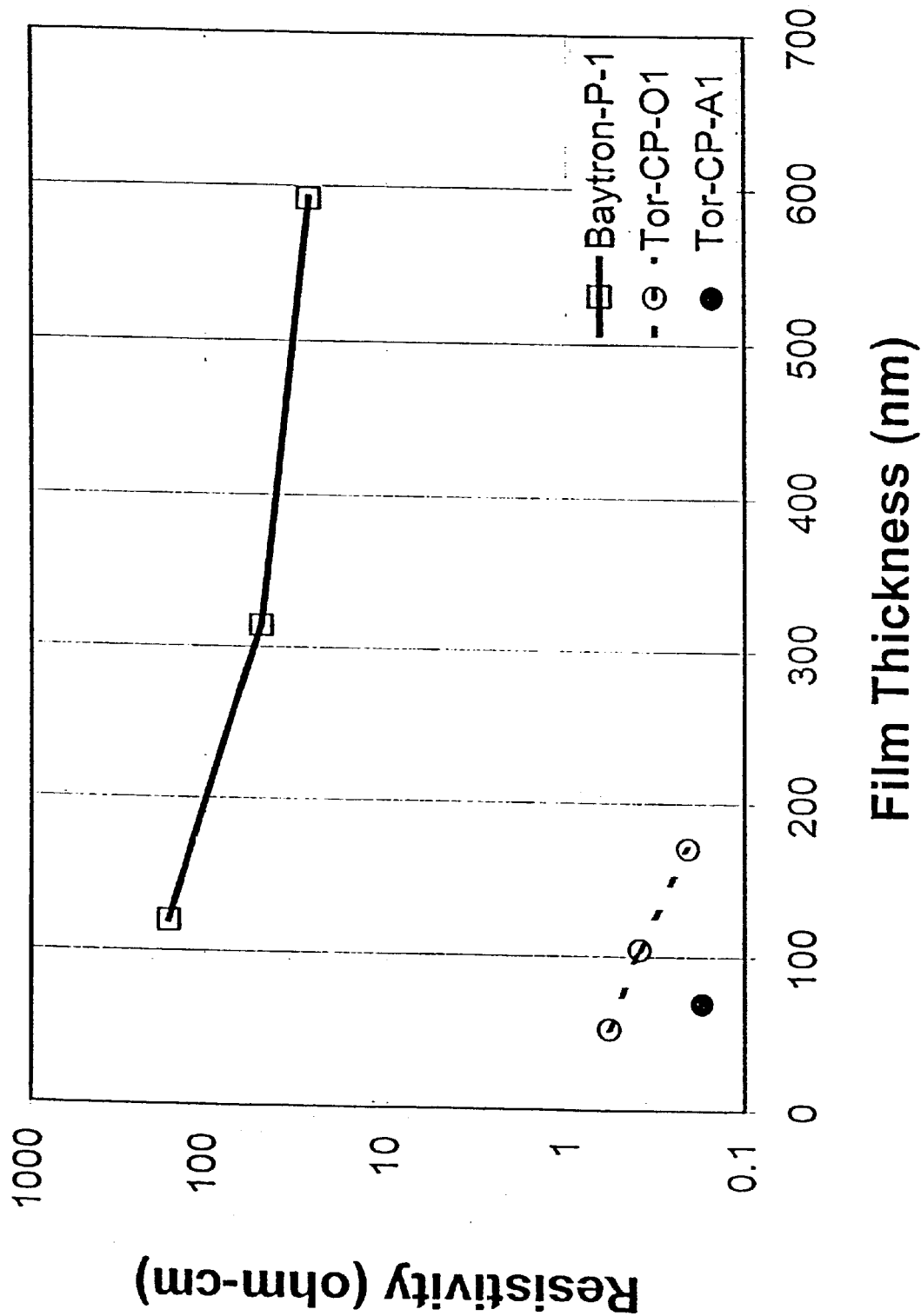

FIGS. 9A–D are explained in more detail as follows. In particular, FIG. 9A shows measured values of electrical resistivity of the resulting coatings as a function of coating thickness for Baytron-P and Tor-CP coatings. For Tor-CP coatings two different drying methods were employed as described in Table 2. Resistivity of these coatings was measured by employing a standard four point probe technique and calculated for the known coating thickness and geometrical correction factor (ASTM Standard F374). Accuracy of the measured values of resistivity using four point probe method were confirmed by employing a Van der Pauw technique for the selected coating at outside laboratory.

As shown in FIG. 9A for the given coating thickness, coatings from Tor-CP exhibited at least two orders of lower resistivity, higher electric conductivity, than that of Baytron-P coatings. For example, resistivity of the 105 nm thickness Tor-CP coating was 0.35 ohm-cm, while Resistivity of the 120 nm thickness Baytron-P coating was 162.74 ohm-cm. Furthermore, air/oven dried Tor-CP coatings exhibited 2–3 times lower resistivity than that of oven dried Tor-CP coatings. In air/oven dried Tor-CP coating, we measured Resistivity as low as 0.15 ohm-cm for coating thickness of 107 nm. There have been reports of lower Resistivity values than measured in the present example for the Baytron-P conducting polymer families. However, specific test conditions and coating process conditions are not clearly reported. Direct comparison between externally reported values and our measured resistivity values for Baytron-P are not always accurate. Resistivity values for the Baytron-P coatings were used as a reference in the present invention when coatings of Baytron-P and Tor-CP were processed and measured same way.

It is significant that the air/oven dried coatings exhibited lower Resistivity than the oven dried coating, while other measured properties are appears to be same such as optical transmission/absorbance and surface morphology. Without wishing to be bound to theory, it is possible that the method impacts micro structural properties.

Coating samples made from Tor-CP or Baytron-P were intentionally exposed to uncontrolled laboratory conditions without any protection. About a month after, Resistivity of these samples was re-measured. While resistivities of the Tor-CP coating were remained the same (unchanged), Baytron-P coating became too soft. Without wishing to be bound to any theory, it is possible that the Baytron-P reacts with moisture in the ambient atmosphere, and resistivity could not be determined by using the four point probe. This result clearly indicated that coatings of Tor-CP are substantially more stable than that of Baytron-P.

Treatment temperatures of up to about 200 C. have been achieved by oven drying. Substantially better results were not always seen.

Figures 11, 12:
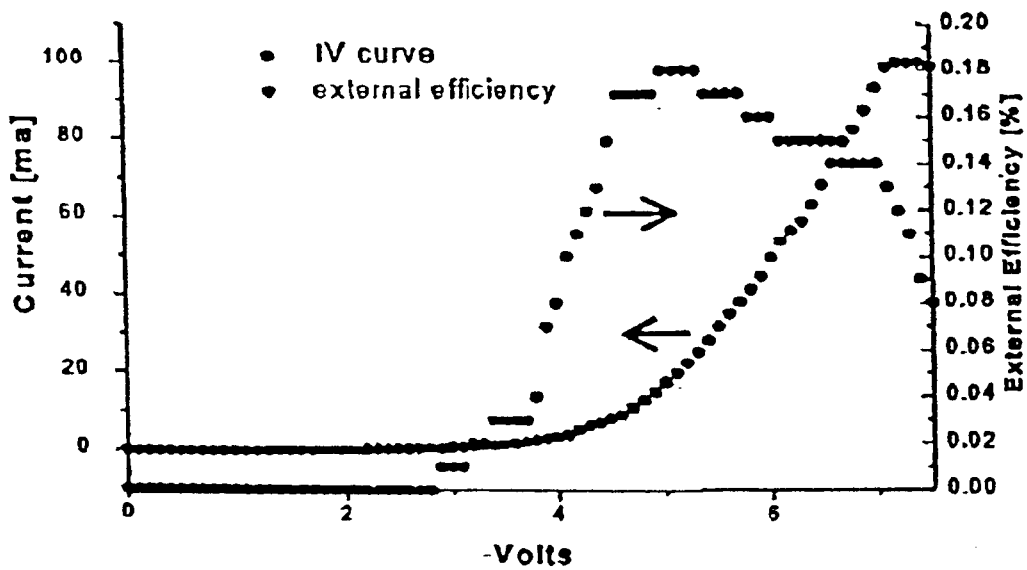
FIG. 11 is a graph showing performance of a OLED of the invention made with TOR-CP as a hole injection layer (HIL).
FIG. 12 is a table showing resistivity and surface resistance data for selected TOR-CP and Baytron-P samples. The data generally show that TOR-CP features better surface resistance and resistivity characteristics than Baytron-P.

See also FIG. 12 providing resistivity and resistance data for selected TOR-CP and Baytron-P samples.

EXAMPLE 7

Optical Transmission of TOR-CP and Baytron-P Coatings

Figure 10:
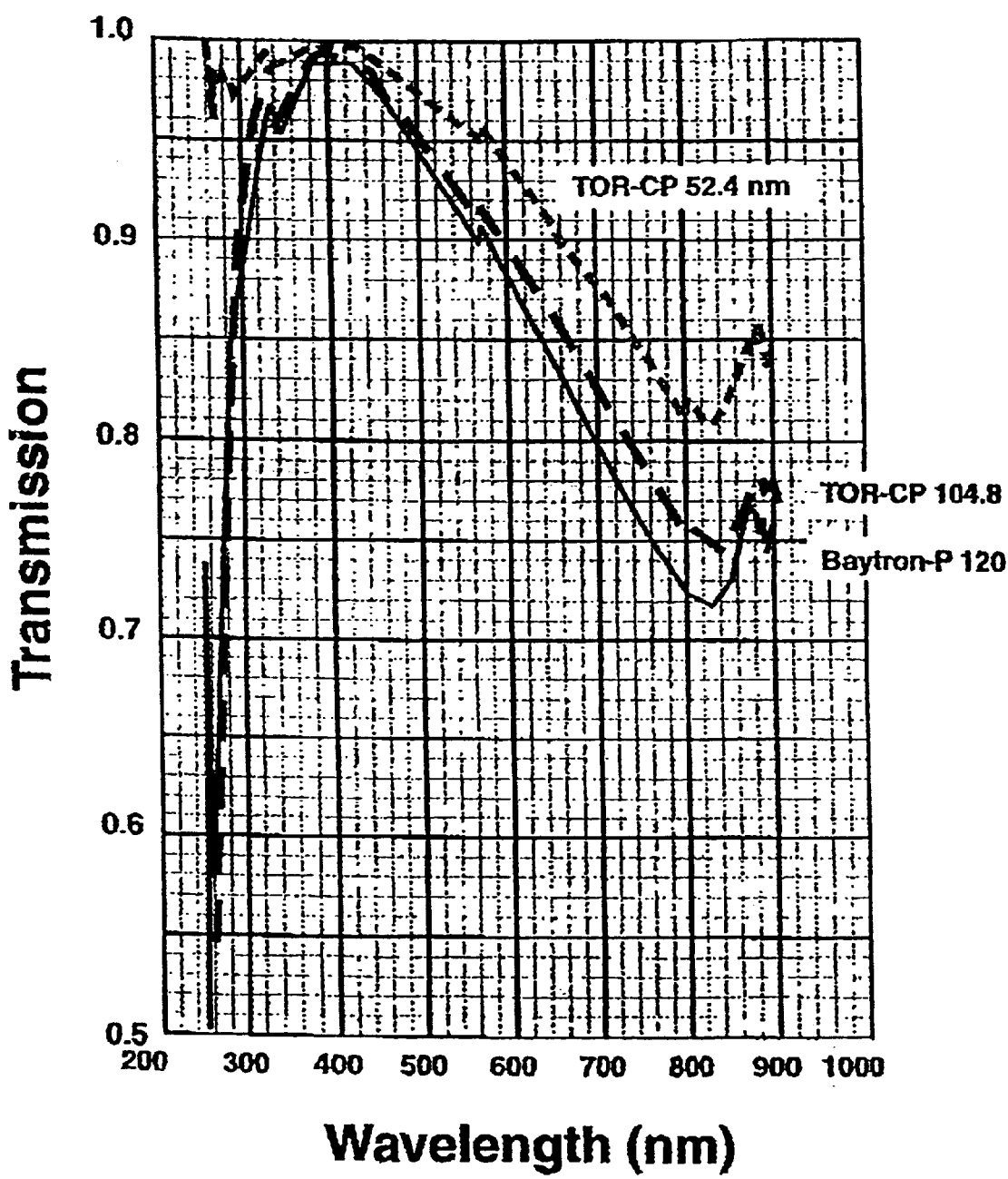
FIG. 10 is a graph showing optical transparencies of spin-coated films of TOR-CP and Baytron-P on glass substrates as a function of wavelength.

FIG. 10 shows optical transmission of the Tor-CP and Baytron-P coatings, as a function of coating thickness, determined by UV-Vis-near IR dual beam differential spectrophotometer (Varian Model No. 2200). Black glass substrate (no coating on it) was used as a reference sample for each test, therefore, measured values of transmission/absorbance were coating layer properties only. Briefly, samples were scanned between 900 nm and 260 nm ranges with spectral bandwidth of 1 nm and scan rate of 1 nm/sec. As shown in FIG. 10, optical transmission/absorbance property is almost same for the coating of Tor-CP and Baytron-P for the given coating thickness. For a 105 nm thickness Tor-CP coating, transmission was above 90% wavelength ranges between 300 nm and 600 nm and it gradually dropped to 83% at 700 nm. A 120 nm thickness Baytron-P coating exhibited similar transmission/absorbance characteristics in the same measurement.

EXAMPLE 8

Preparation and Use of an OLED

Standard OLED devices, with Tor-CP or Baytron-P as a hole injection buffer layer, were fabricated and characterized. See generally *Organic Light-Emitting Materials and Devices IV*, Kafafi, Z. H. Editor, in *Proceedings of SPIE*, vol. 4105 (2001) and references cited therein for disclosure relating to making and using standard OLED and related devices.

The specific device structure used in both cases was: ITO (150 nm)/Tor-CP or PEDOT:PSS/TPD (20 nm)/Alq$_3$ (40 nm)/LiF (0.5 nm)/Al (200 nm). As shown in FIG. 11, OLED with Tor-CP reached a peak external quantum efficiency of 0.18% or a peak power efficiency of 1.08 lm/W at an applied bias of 5.10 V and a luminance of 8,790 cd/m$^2$. The maximum luminance of 32,000 cd/m$^2$ was obtained at 7.1 V. This compares to a similar water based PEDOT:PSS sample (heated at 50° C. and dried in N$_2$) fabricated at the same time which had a peak external quantum efficiency of 0.15% or a peak power efficiency of 0.82 lm/W at an applied bias of 5.40 V and a luminance of 8,620 cd/m$^2$. The water based (PEDOT) device had a maximum luminance of 14,700 cd/m$^2$ obtained at 7.0 V. The superior performance of the Tor-CP in OLED devices suggests that improved electrical characteristics (for such applications) has been achieved. See also FIG. 11.

As illustrated by this example, the OLED with the TOR-CP exhibited a better performance than the corresponding OLED with Baytron-P ITO.

EXAMPLE 9

Use of Tor-CP as an Electrode

Tor-CP can be used as an anode electrodes for display applications by replacing current industry standard of indium doped tin oxides (ITO). An example of this application is shown in FIGS. 13 and 14.

Figure 13:
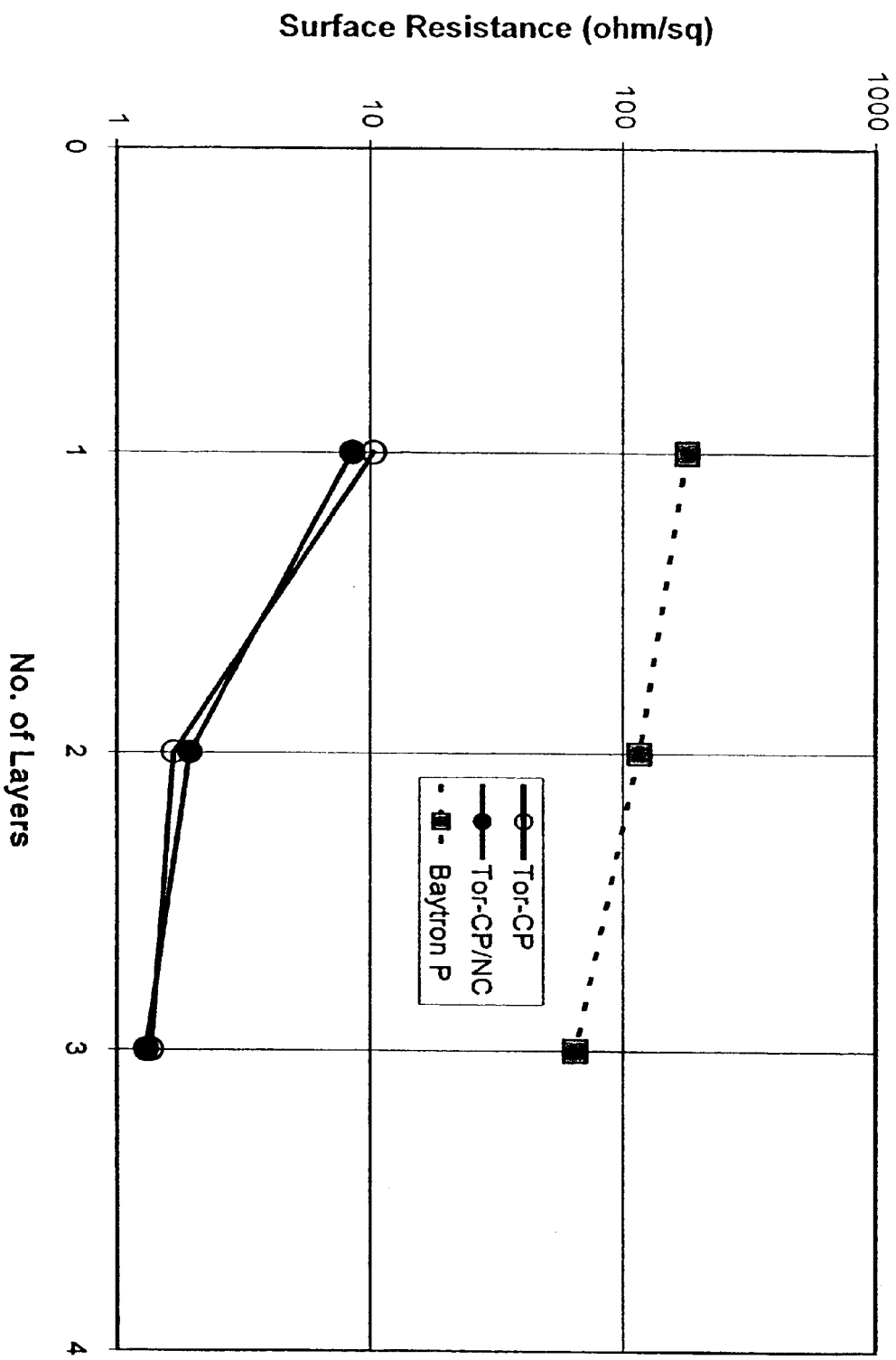
FIG. 13 is a graph showing surface resistance of CP coatings and Baytron P on a PET substrate

In FIG. 13, measured surface resistance (in ohm/sq.) of the Tor-CP coating on 5 mil thickness PET substrate is shown as a function of number of spin coating layers. Baytron-P from Bayer A. G. was used as a reference material in this experiment. With two to three layer spin coatings, Tor-CP exhibited about 1–2 kohm/sq. surface resistance whereas Baytron-P exhibited about 100 kohm/sq. Optical transmission for the same set of coatings is above 86% and below 80% for Tor-CP and Baytron-P, respectively. Generally, for certain display applications, such as touch screen, anode electrode (currently ITO) should have surface resistance of less than 1–2 kohm/sq. and optical transmission of above 86%. Clearly, Tor-CP coatings can meet these requirements.

In addition, adhesion tests of these samples following Mil-C-4897A test protocol were also conducted. Results of this test indicated that Tor-CP exhibited very good adhesion rating of 4B, compared to very poor adhesion of Baytron-P on PET. Since the Tor-CP is in NMP, there is a surface mixing effect between Tor-CP and PET substrate whereas aqueous based Baytron-P may not have the mixing effect. The mixing effect between the Tor-CP and PET substrates at the interface would provide good adhesion.

Figure 14:
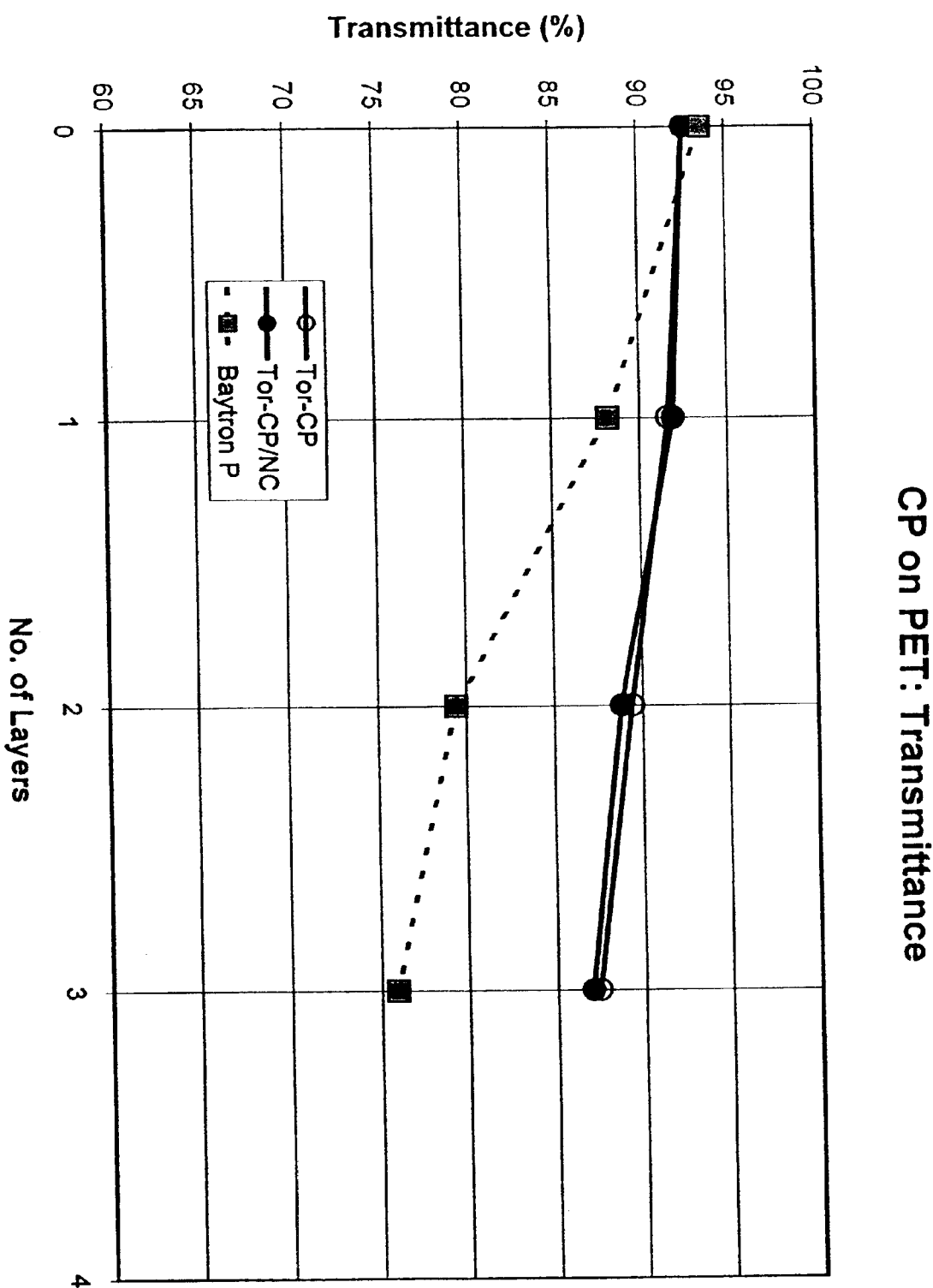
FIG. 14 is graph showing light transmittance of CP coatings and Baytron P on a PET substrate.

FIG. 15 shows data in support of FIGS. 13 and 14.

EXAMPLE 10

Properties of Tor-CP and Baytron-P Coatings

Figure 16:
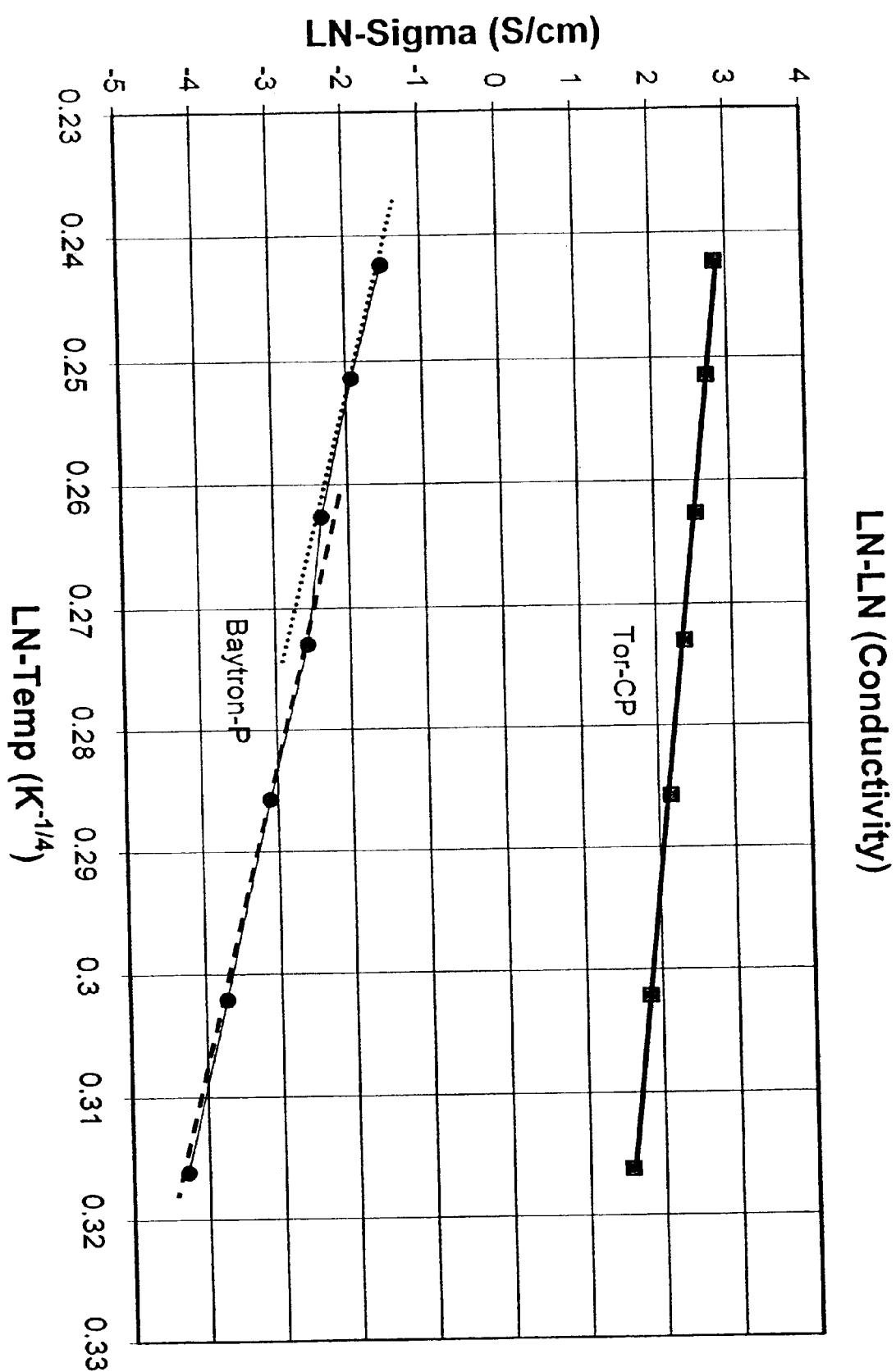
FIG. 16 is a graph showing Ln-Ln conductivity data of Tor-CP and Baytron P at various temperatures.
Figure 17:
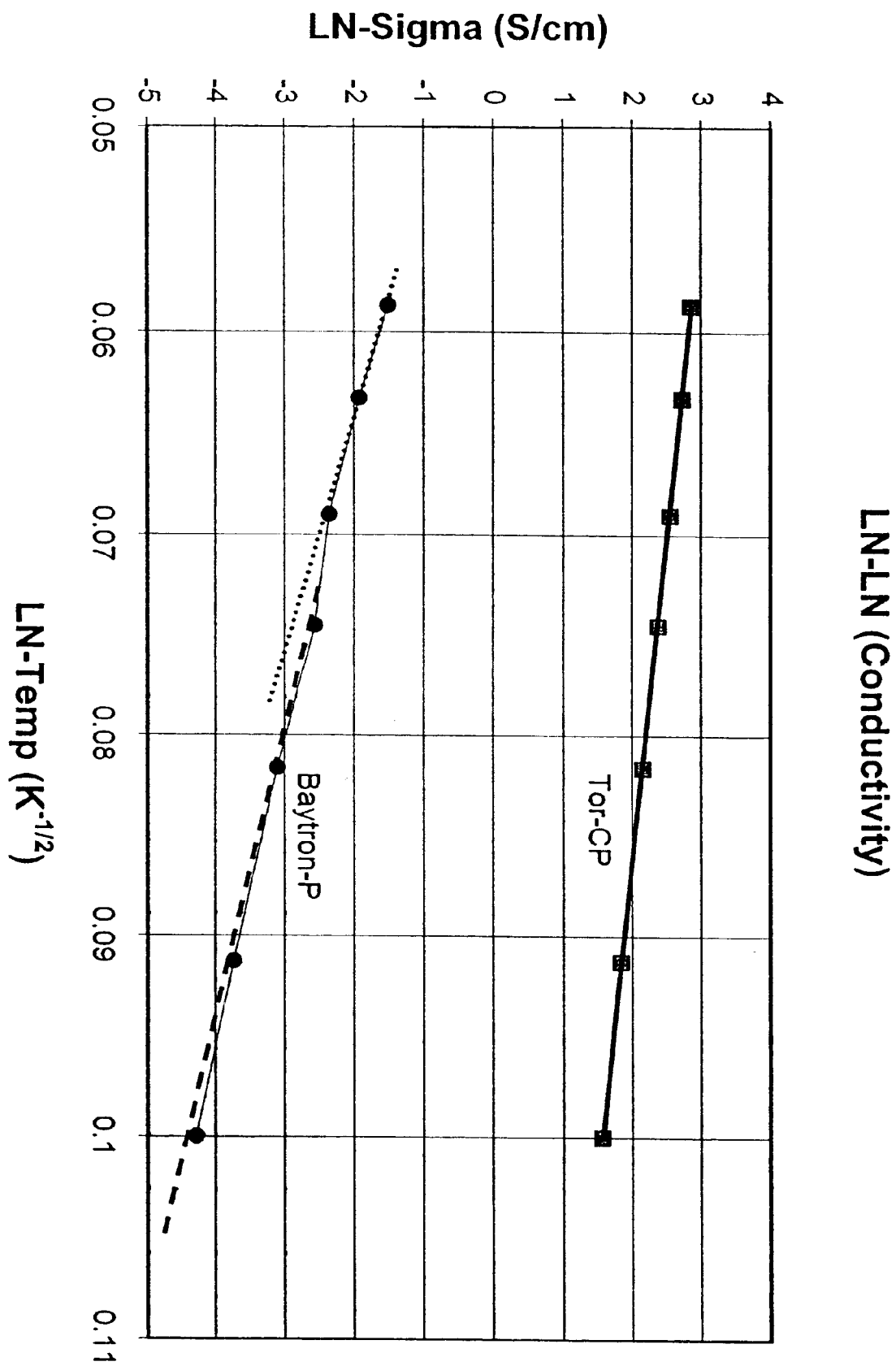
FIG. 17 is also a graph showing Ln-Ln conductivity data of Tor-CP and Baytron P at various temperatures.

Resistivity/Conductivity of Tor-CP and Baytron-P coatings on glass substrates were determined by employing van der Pauw method in temperature ranges between 100–300 K. Thickness of the coatings used in this test were between 400–500 nm. Ln-Ln plots of the conductivity results are shown in FIGS. 16 and 17. As shown in these figures, Tor-CP coatings exhibited two orders higher conductivity than Baytron-P coatings in entire temperature ranges. In addition, Baytron-P coatings exhibited a kink at temperatures around 150 K whereas there is no kink in the plots of Tor-CP coatings. It is believed that the kink in the Ln-Ln plot of the conductivity indicated the changes in charge carrier transport mechanism in the Baytron-P coatings. No kink in the Tor-CP coatings probably implies solid charge carrier transport mechanism in Tor-CP coatings and might attribute to the many orders higher mobility in the Tor-CP coatings.

All references disclosed in this application are incorporated herein by reference.

While the invention has been described with reference to specific embodiments, modifications and variations of the invention may be constructed without departing from the scope of the invention, which is defined in the following claims.

What is claimed is:

1. A composition comprising:
    a combination of an aqueous dispersion of an optionally substituted poly-3,4 alkylene dioxythiophene cation and an associated polyanion; and
    1% (w/v) to 100% (w/v) of at least one of dimethylacetamide (DMAC), N-methylpyrrolidone (NMP), ethylene glycol, or mixtures thereof, wherein at least 30% (w/v) of the water from the aqueous dispersion is removed from said combination.

2. The composition of claim 1, wherein at least 90% of the water from the aqueous dispersion is removed.

3. The composition of claim 1, wherein the polyanion is polystyrene sulfonic acid (PSS).

4. The composition of claim 1, wherein the aqueous dispersion of said optionally substituted poly-3,4-alkylene dioxythiophene includes an aqueous dispersion of 0.5–5% by weight of poly-3,4-ethylene dioxythiophene and the anion is polystyrene sulfonic acid.

5. The composition of claim 1 further comprising at least one additive.

6. The composition of claim 5, wherein the additive is a binder.

7. The composition of claim 5, wherein the additive is ferric toluene sulfonic acid.

8. The composition of claim 7, wherein the ferric toluene sulfonic acid is present in trace amounts.

9. The composition of claim 1, wherein a coating of composition has at least an order of magnitude higher conductivity than a coating of corresponding unexchanged optionally substituted poly-3,4-alkylene dioxythiophene aqueous dispersion.

10. The composition of claim 9 wherein the aqueous dispersion of said optionally substituted poly-3,4-alkylene dioxythiophene includes an aqueous dispersion of 0.5–5% by weight of poly-3,4-ethylene dioxythiophene and the anion is polystyrene sulfonic acid.

11. The composition of claim 10, further including at least one water insoluble solvent.

12. The composition of claim 1 wherein the aqueous dispersion of the optionally substituted poly-3,4-alkylene dioxythiophene cation and an associated polyanion is from about 0.38% to about 1.55% by weight of said composition.

* * * * *